(12) United States Patent
Fujimoto

(10) Patent No.: US 8,994,122 B2
(45) Date of Patent: Mar. 31, 2015

(54) SEMICONDUCTOR DEVICE HAVING A MEMORY CELL REGION AND A PERIPHERAL TRANSISTOR REGION

(71) Applicant: Elpida Memory, Inc., Tokyo (JP)

(72) Inventor: Hiroyuki Fujimoto, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/785,494

(22) Filed: Mar. 5, 2013

(65) Prior Publication Data

US 2013/0241009 A1 Sep. 19, 2013

(30) Foreign Application Priority Data

Mar. 15, 2012 (JP) .................... 2012-058781

(51) Int. Cl.
 *H01L 21/02* (2006.01)
 *H01L 29/49* (2006.01)
 *H01L 27/108* (2006.01)

(52) U.S. Cl.
 CPC ...... *H01L 29/4925* (2013.01); *H01L 27/10829* (2013.01); *H01L 27/10885* (2013.01); *H01L 27/10888* (2013.01)
 USPC .......................................... 257/410; 257/412

(58) Field of Classification Search
 CPC .................................................. H01L 29/4925
 USPC .................................................. 257/410, 412
 See application file for complete search history.

(56) References Cited

U.S. PATENT DOCUMENTS

| 2003/0011002 A1* | 1/2003 | Takaura et al. ............... 257/200 |
| 2008/0061357 A1* | 3/2008 | Sakuma et al. ............... 257/316 |
| 2008/0191292 A1* | 8/2008 | Callegari et al. ............. 257/411 |
| 2009/0072289 A1* | 3/2009 | Kim et al. ..................... 257/298 |
| 2010/0155799 A1* | 6/2010 | Yokoyama .................... 257/296 |
| 2011/0156119 A1* | 6/2011 | Chung et al. ................. 257/306 |

FOREIGN PATENT DOCUMENTS

| JP | 2005-142203 | 6/2005 |
| JP | 2011-014689 | 1/2011 |
| JP | 2011-049282 | 3/2011 |

* cited by examiner

*Primary Examiner* — Jarrett Stark
*Assistant Examiner* — Mohammad M Hoque
(74) *Attorney, Agent, or Firm* — Young & Thompson

(57) ABSTRACT

A memory cell region comprises a first interlayer insulating film having a bit contact hole, a contact plug formed of a first conductor film embedded in the bit contact hole, and a second conductor film which is stacked on the first interlayer insulating film to constitute a bit line connected to the contact plug. A peripheral transistor region comprises a peripheral transistor having a gate insulating film and a gate electrode stack formed on the gate insulating film. The gate electrode stack is provided with a metal gate film formed on the gate insulating film, an upper gate film stacked on the metal gate film, and a third conductor film stacked on the upper gate film. A height from a semiconductor substrate to a top face of the upper gate film is equal to or lower than a height of a top face of the first interlayer insulating film.

15 Claims, 15 Drawing Sheets

SEMICONDUCTOR DEVICE HAVING A MEMORY CELL REGION AND A PERIPHERAL TRANSISTOR REGION

This application is based upon and claims priority to prior application Japanese Patent Application No. 2012-58781, filed on Mar. 15, 2012, the disclosure of which is incorporated herein by reference.

BACKGROUND OF THE INVENTION

1. Field of the Invention

This invention relates to a semiconductor device.

2. Description of Related Art

There has been principally used a silicon oxide film as a gate insulating film in semiconductor devices having planar transistors. However, as the configuration of semiconductor devices has been more and more miniaturized and integrated, and silicon oxide films serving as gate insulating films have been made thinner, leak current has increased to a non-negligible level. Therefore, attempts have been made to use a high-k (high dielectric-constant) film with a high relative dielectric constant in a gate insulating film.

Japanese Patent Application Publication No. 2011-14689 (Patent Document 1) discloses a planar transistor which is designed to realize a large work function by segregating halogens on an interface between a gate insulating film including a high-k film formed on a semiconductor substrate and a metal gate film formed on the gate insulating film.

Japanese Patent Application Publication No. 2011-49282 (Patent Document 2) discloses a technique for forming a high-performance and low-voltage metal-insulator-semiconductor field effect transistor (MISFE) by using a damascene process to form a gate insulating film including a high-k film and a metal gate film without exposing the gate insulating film and the metal gate film to annealing for activation of source and drain regions.

On the other hand, the short channel effect of planar transistors has become more noticeable as the configuration of semiconductor devices is miniaturized as described above. In order to prevent reduction of threshold voltage possibly caused by this short channel effect, an embedded gate transistor has been proposed, in which a gate insulating film is formed on the inner walls of a trench for gate electrode formed in the surface of a semiconductor substrate, and a gate electrode is embedded in the trench surrounded by the gate insulating film.

Japanese Patent Application Publication No. 2005-142203 (Patent Document 3) discloses an embedded gate transistor which is designed to suppress reduction of effective electric field and increase of threshold voltage by forming a gate insulating film on inner walls of a trench for gate electrode such that the gate insulating film has a smaller thickness at the corners of the trench bottom at least than the thickness of the film on the side walls of the trench.

As described above, there are known various techniques to cope with miniaturization and integration of semiconductor devices.

In some semiconductor devices such as a DRAM (Dynamic Random Access Memory), an embedded gate transistor is used in a memory cell region while a planar transistor having a gate insulating film including a high-k film is used in a peripheral transistor region.

The inventors of this invention have reviewed a DRAM having the aforementioned configuration and the manufacturing method thereof, and results obtained will be described with reference to FIGS. 18 to 29.

As shown in FIG. 18, a DRAM (semiconductor device) 300 has a memory cell region 300a and a peripheral transistor region 300b. The memory cell region 300a and the peripheral transistor region 300b are divided into a plurality of active regions 11a, 11b, 11c by STIs (Shallow Trench Isolations) 12 formed in a semiconductor substrate 10. There are formed, in the active region 11a of the memory cell region 300a, embedded gate transistors for memory cells. There are respectively formed, in the active regions 11b and 11c of the peripheral transistor region 300b, n-channel and p-channel planar transistors (hereafter, referred to as the peripheral transistors) each having a gate insulating film including a high-k film.

A manufacturing method of the DRAM 300 will be described with reference to FIGS. 19 to 29.

Firstly, as shown in FIG. 19, STIs 12 for defining the active regions 11a, 11b, and 11c are formed in a semiconductor substrate 10 formed of a p-type silicon substrate. Then, an insulating film 16 is formed to cover the top faces of the STIs 12 and the semiconductor substrate 10

As shown in FIG. 20, embedded gate transistors are formed in the active region 11a of the memory cell region 300a. Each of the embedded gate transistors for memory cells has a gate insulating film 18, a gate electrode 20, an insulating film 23, and impurity diffusion regions 14a, 14b.

Subsequently, as shown in FIG. 21, a silicon oxide film 26' is formed on the structure shown in FIG. 20. As shown in FIG. 22, the silicon oxide film 26' on the peripheral transistor region 300b is removed, whereby a first interlayer insulating film 26 is formed in the memory cell region 300a.

Next, as shown in FIG. 23, a high-k film 28' is formed to cover the first interlayer insulating film 26 and the insulating film 16 in the peripheral transistor region 300b.

After that, a metal film and a doped polysilicon film are sequentially stacked on the structure shown in FIG. 23, and the stacked films are patterned. Thus, as shown in FIGS. 24 and 25, a metal gate film 30 and an upper gate film 32 are formed in each of the active regions 11b, 11c of the peripheral transistor region 300b. The height from the semiconductor substrate 10 to the top face of the metal gate film 30 sometimes becomes higher than the height from the semiconductor substrate 10 to the top face of the first interlayer insulating film 26. Further, as shown in FIG. 25, the height b of the top face of the upper gate film 32 sometimes becomes higher than the height A of the top face of the first interlayer insulating film 26.

Next, the high-k film 28' in the memory cell region 300a and the peripheral transistor region 300b except the one under the metal gate film 30 are removed. As a result, as shown in FIG. 26, a gate insulating film 28 including a high-k film is formed in each of the active regions 11b, 11c of the peripheral transistor region 300b.

Next, as shown in FIG. 27, bit contact holes 27 are formed in the first interlayer insulating film 26. Subsequently, as shown in FIG. 28, a first interlayer insulating film 26 is formed to fill the bit contact holes 27 while a fifth conductor film 39 is formed to cover the upper gate film 32.

Subsequently, a sixth conductor film 43 is stacked on the fifth conductor film 39. When the height of the top face of the upper gate film 32 is higher than the height of the top face of the first interlayer insulating film 26, there is generated a difference in level between the top face of the fifth conductor film 39 and the top face of the sixth conductor film 43.

After that, as shown in FIG. 29, CMP (Chemical Mechanical Polishing) or etching is performed so that a contact plug 42 formed of a first conductor film obtained by processing the fifth conductor film 39 and a second conductor film 45 obtained by processing the sixth conductor film 43 are formed in the memory cell region 300a. The second conductor film 45 constitutes a bit line. Gate electrode stacks 49 are formed on the gate insulating film 28 in the peripheral transistor region 300b. Each of the gate electrode stacks 49 has a metal gate film 30, an upper gate film 32, a fourth conductor film 40 obtained by processing the fifth conductor film 39, and a third conductor film 44 obtained by processing the sixth conductor film 43.

Subsequently, low concentration impurity diffusion regions 46n, 46p and high concentration impurity diffusion regions 48n, 48p are formed in the semiconductor substrate 10 at the widthwise opposite ends of the gate electrode stack 49.

Subsequently, according to the same procedures as a conventional semiconductor device manufacturing method, as shown in FIG. 18, an insulating film 55, capacitors 54 in the memory cell region 300a, contact plugs 50 in the peripheral transistor region 300b, upper wirings 51, 53, via plugs 52 and the like are formed to complete a DRAM 300.

SUMMARY

However, according to the manufacturing method of the DRAM 300 as described above, the height B from the semiconductor substrate 10 to the top face of the metal gate film 30 may sometimes become greater than the height A from the semiconductor substrate 10 to the top face of the first interlayer insulating film 26, or the height b of the top face of the upper gate film 32 may sometimes become higher than the height A of the of the top face of the first interlayer insulating film 26, as shown in FIG. 18. Therefore, when the first interlayer insulating film 26 is formed as a CMP stopper, or the contact plugs 42, the second conductor film 45 and the gate electrode stacks 49 are formed for determining the etching end point, the metal gate film 30 and the upper gate film 32 for controlling threshold voltage of the peripheral transistors will be partially or totally removed.

In other words, since there is no film that can be used as CMP stopper or for determining the etching end point, the CMP or etching is difficult to control when forming the formation of the contact plugs 42, the second conductor film 45 and the gate electrode stacks 49.

When the control of CMP or etching is difficult in the formation of the contact plugs 42, the second conductor film 45 and the gate electrode stacks 49, the uniformity of the DRAM 300 may possibly be reduced and the yield of the DRAM 300 may be degraded.

If the steps of manufacturing the DRAM 300 after the formation of the contact plugs 42, the second conductor film 45 and the gate electrode stacks 49 are performed separately between the memory cell region 300a and the peripheral transistor region 300b in order to avoid the aforementioned problem, the manufacturing process will become complicated.

In one embodiment, there is provided a semiconductor device comprising a semiconductor substrate including a memory cell region and a peripheral transistor region. The memory cell region comprises an embedded gate transistor for memory cell, a first interlayer insulating film having a bit contact hole, a contact plug formed of a first conductor film embedded in the bit contact hole, and a second conductor film which is stacked on the first interlayer insulating film to constitute a bit line connected to the contact plug. The peripheral transistor region comprises a peripheral transistor having a gate insulating film including a high-k film and a gate electrode stack formed on the gate insulating film. The gate electrode stack is provided at least with a metal gate film formed on the gate insulating film, an upper gate film stacked on the metal gate film, and a third conductor film stacked on the upper gate film. The third conductor film is formed of the same material and having the same thickness as the second conductor film. A height from the semiconductor substrate to a top face of the upper gate film is equal to or lower than a height of a top face of the first interlayer insulating film.

In another embodiment, there is provided a semiconductor device comprising a semiconductor substrate in which a first region and a second region are defined, a diffusion layer arranged on the semiconductor substrate in the first region, a first interlayer insulating film arranged on the first region, a contact plug passing through the first interlayer insulating film and electrically connected to the diffusion layer, and a transistor arranged in the second region and comprising a gate insulating film including a high-k film, a first conductor layer arranged on the gate insulating film, and a second conductor layer arranged on the first conductor layer. As viewed from the surface of the semiconductor substrate, a height of a top face of the second conductor layer is equal to or lower than a height of a top face of the first interlayer insulating film.

In still another embodiment, there is provided a semiconductor device comprising a semiconductor substrate in which a first region and a second region are defined, a diffusion layer arranged on the semiconductor substrate in the first region, a first interlayer insulating film arranged on the first region, a contact plug passing through the first interlayer insulating film and electrically connected to the diffusion layer, and a transistor arranged in the second region and comprising a gate insulating film, a metal layer arranged on the gate insulating film, and a first conductor layer arranged on the metal layer. As viewed from the surface of the semiconductor substrate, a height of a top face of the first conductor layer is substantially the same as a height of a top face of the first interlayer insulating film.

According to the invention, the height from the semiconductor substrate to the top face of the upper gate film is equal to or lower than the height from the semiconductor substrate to the top face of the first interlayer insulating film. Therefore, the first interlayer insulating film or the upper gate film functions as a CMP stopper or as an index for determining etching endpoint in the steps of forming the contact plugs, the second conductor film and the gate electrode stack. This makes it possible to prevent damage to or loss of the metal gate film and the upper gate film.

Further, since the control of the CMP or etching is facilitated in the steps of forming the contact plugs, the second conductor film and the gate electrode stack, the uniformity of the semiconductor device is improved. This facilitates gate etching and improves the yield of the semiconductor device.

Furthermore, the semiconductor device manufacturing steps after the formation of the contact plugs, the second conductor film and the gate electrode stack in the memory cell region and the peripheral transistor region can be performed collectively.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Figure 1:
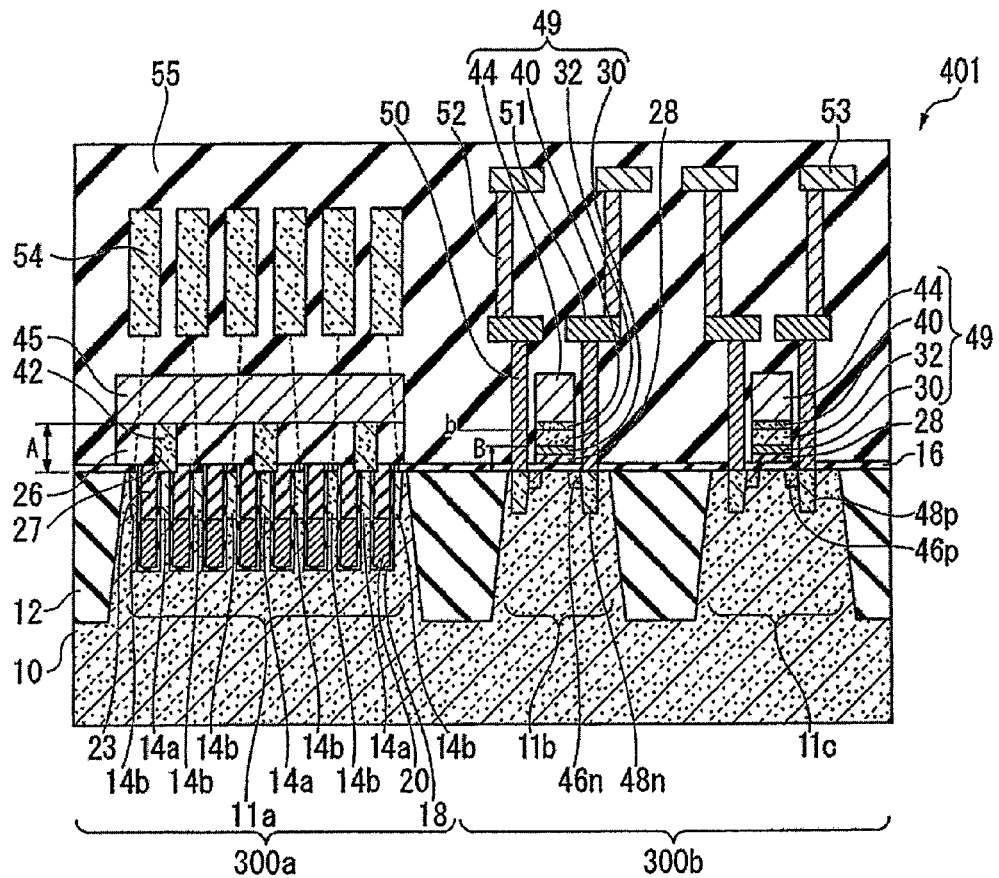
FIG. 1 is a cross-sectional view showing a configuration of a semiconductor device according to a first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device and a manufacturing method thereof according to the invention will be described with reference to FIGS. 1 to 17. In FIGS. 1 to 17, the same members or components are indicated by the same reference numerals and overlapping description will be omitted. It should be noted that the drawings used in the description are only schematic and ratios of length, width, and thickness of the components are not always the same as actual ones.

(First Embodiment)

A DRAM (semiconductor device) 401 according to a first embodiment of the invention and a manufacturing method thereof will be described with reference to FIGS. 1 to 13.

Firstly, referring to FIG. 1, a configuration of the DRAM 401 will be described.

As shown in FIG. 1, the DRAM 401 is composed of a memory cell region 300a and a peripheral transistor region 300b.

The memory cell region (first region) 300a and the peripheral transistor region (second region) 300b are divided into a plurality of active regions 11a, 11b, and 11c by STIs 12 formed in a semiconductor substrate 10. Although FIG. 1 shows a configuration in which the active regions 11a, 11b, and 11c are arranged adjacent to each other, the invention is not limited to this arrangement.

A p-type silicon substrate is used for the semiconductor substrate 10. A silicon oxide film is used for the STIs 12.

Memory cells of the DRAM 401 are provided in the active region 11a. An n-channel and p-channel peripheral transistors are provided, respectively, in the active regions 11b and 11c.

A configuration of memory cells formed in the active region 11a is described.

The memory cells of the DRAM 401 are of a 6F2 cell arrangement (F denotes a minimum processing dimension of the semiconductor device). Each of the memory cells of the DRAM 401 has an embedded gate transistor, a first interlayer insulating film 26, a contact plug 42, a second conductor film (fourth conductor layer) 45, and a capacitor 54.

The embedded gate transistor for the memory cell has a gate insulating film 18, a gate electrode 20, an insulating film 23, and impurity diffusion regions 14a, 14b.

The gate insulating film 18 is provided on inner walls of each trench for gate electrode formed in the semiconductor substrate 10 in the active region 11a. The gate insulating film 18 is formed of a silicon oxide film, for example.

The gate electrode 20 is provided in a lower part of the trench surrounded by the gate insulating film 18. The gate electrode 20 is formed of a metal having a high melting point such as tungsten.

The insulating film 23 is provided to fill the trench surrounded by the gate insulating film 18 in the upper part of the gate electrode 20. The insulating film 23 is formed, for example, of a silicon nitride film or a silicon oxide film.

The impurity diffusion regions 14a, 14b are provided in an upper part of the semiconductor substrate 10, between the adjacent gate electrodes 20 and between the gate electrode 20 and the STI 12. The impurity diffusion regions 14a, 14b have an impurity dopant of a different conductivity type (n-type in the first embodiment) from that of the semiconductor substrate 10, and are formed by implanting an n-type impurity dopant into the semiconductor substrate 10, or by embedding an impurity semiconductor containing an n-type impurity dopant.

Each of the impurity diffusion regions 14a is connected to a second conductor film 45 constituting a bit line, via the contact plug 42 to be described later, and functions as a source region of the embedded gate transistor.

Each of the impurity diffusion regions 14b is connected to a capacitor 54 to be described later, and functions as a drain region of the embedded gate transistor.

The first interlayer insulating film 26 is provided on memory cells formed by the embedded gate transistors and has bit contact holes 27. The bottom of each bit contact hole 27 is in contact with the impurity diffusion region 14a. The first interlayer insulating film 26 is formed, for example, of a silicon oxide film.

The height A from the semiconductor substrate 10 to the top face of the first interlayer insulating film 26 is greater than the height B from the semiconductor substrate 10 to the top face of a metal gate film 30 to be described later. The height A of the top face of the first interlayer insulating film 26 is equal to or higher than the height b of the top face of the upper gate film 32.

Each of the contact plugs 42 is formed by embedding a first conductor film to be described later in the bit contact hole 27. The first conductor film is formed, for example, of a metal film such as tungsten, or a doped polysilicon film.

The second conductor film 45 is stacked on the first interlayer insulating film 26. The second conductor film 45 is connected to the contact plugs 42 and constitutes bit lines of the memory cells.

The capacitors 54 connected to the impurity diffusion regions 14b are provided above the second conductor film 45. The capacitors 54 may assume any structure generally used for a DRAM, such as cylinder type or crown type.

Contact plugs (not shown) may be provided between the capacitors 54 and the impurity diffusion regions 14b.

The active region 11b has an n-channel peripheral transistor, contact plugs 50, via plugs 52, and upper wirings 51, 53.

Next, a configuration of the n-channel peripheral transistor formed in the active region 11b will be described. The n-channel peripheral transistor has a gate insulating film 28, a gate electrode stack 49, a low concentration impurity diffusion region 46n, and a high concentration impurity diffusion region 48n.

The gate insulating film 28 is provided on the semiconductor substrate 10 in the active region 11b via the insulating film 16. The gate insulating film 28 includes a high-k film made of a high dielectric material such as hafnium.

The gate electrode stack 49 has a metal gate film (first conductor layer) 30, an upper gate film (second conductor layer) 32, a fourth conductor film (third conductor layer) 40, and a third conductor film (fifth conductor layer) 44.

The metal gate film 30 is provided on the gate insulating film 28. The metal gate film 30 is formed of a metal film such as nickel film, which has good controllability on threshold voltage of the peripheral transistor when combined with the high-k film.

The thickness of the metal gate film 30 is determined in accordance with the threshold voltage of the peripheral transistor. The height B from the semiconductor substrate 10 to the top face of the metal gate film 30 is smaller than the height A from the semiconductor substrate 10 to the top face of the first interlayer insulating film 26.

The upper gate film 32 is provided on the metal gate film 30. The upper gate film 32 is formed, for example, of a doped polysilicon film.

The thickness of the upper gate film 32 is determined in consideration of a threshold voltage of the peripheral transistor and the thickness of the metal gate film 30. The height b of the top face of the upper gate film 32 is equal to or lower than the height A of the top face of the first interlayer insulating film 26.

The fourth conductor film 40 is provided between the upper gate film 32 and a third conductor film 44 to be described later. The fourth conductor film 40 is formed of the same material as that of the first conductor film constituting the contact plugs 42.

The height position of the top face of the fourth conductor film 40 is the same as the height position of the top face of the contact plug 42.

The third conductor film 44 is provided above the upper gate film 32, that is, on the fourth conductor film 40. The third conductor film 44 is formed of the same material as that of the second conductor film 45, and has the same thickness as that of the second conductor film 45. Therefore, the top face of the second conductor film 45 is flush with the top face of the third conductor film 44.

The threshold voltage of the peripheral transistor is determined based on the material and the total thickness of the gate electrode stack 49. The thicknesses of the fourth conductor film 40 and the third conductor film 44 are determined respectively in consideration of a threshold voltage of the peripheral transistor.

The low concentration impurity diffusion regions 46n are provided in the semiconductor substrate 10 on the widthwise opposite sides of the gate electrode stack 49 formed in the active region 11b. The low concentration impurity diffusion regions 46n have an n-type impurity dopant and are formed by the same processes as the impurity diffusion regions 14a and 14b.

The high concentration impurity diffusion regions 48n are provided in the semiconductor substrate 10, adjacent to the low concentration impurity diffusion regions 46n on the sides closer to the STIs 12. The high concentration impurity diffusion regions 48n have a higher concentration of n-type impurity dopant than the low concentration impurity diffusion region 46n, and are formed by the same processes as the impurity diffusion regions 14a and 14b.

The low concentration impurity diffusion regions 46n and the high concentration impurity diffusion regions 48n function as source and drain regions of the n-channel peripheral transistor.

Contact plugs 50 connected to the high concentration impurity diffusion regions 48n are provided on the sides of the gate electrode stack 49. The upper wiring 51 is provided in contact with the top face of each contact plug 50.

A via plug 52 is provided in contact with the upper wiring 51. An upper wiring 53 is further provided on the via plug 52. The contact plug 50 and the via plug 52 are formed of a metal film such as a tungsten film. A multilayer wiring may be formed on the upper wiring 53.

The active region 11c has a p-channel peripheral transistor, a contact plug 50, a via plug 52, and upper wirings 51 and 53.

A configuration of the p-channel peripheral transistor formed in the active region 11c will be described. The p-channel peripheral transistor has a gate insulating film 28, a gate electrode stack 49, low concentration impurity diffusion regions 46p, and high concentration impurity diffusion regions 48p. The arrangement of the gate insulating film 28 and the gate electrode stack 49 of the p-channel peripheral transistor is the same as that of the gate insulating film 28 and the gate electrode stack 49 of the n-channel peripheral transistor, and hence description thereof will be omitted.

The low concentration impurity diffusion regions 46p are provided in the semiconductor substrate 10 on the widthwise opposite sides of the gate electrode stack 49 formed in the active region 11c. The low concentration impurity diffusion regions 46p have a p-type impurity dopant and are formed by the same processes as the impurity diffusion regions 14a and 14b.

The high concentration impurity diffusion regions 48p are provided in the semiconductor substrate 10, adjacent to the low concentration impurity diffusion regions 46p on the sides closer to the STIs 12. The high concentration impurity diffusion regions 48p have a higher concentration of p-type impurity dopant than the low concentration impurity diffusion regions 46p, and are formed by the same processes as the impurity diffusion regions 14a and 14b.

The low concentration impurity diffusion regions 46p and the high concentration impurity diffusion regions 48p function as source and drain regions of the p-channel peripheral transistor.

The portion of the semiconductor substrate 10 in the active region 11c may contain an impurity dopant of a different conductivity type (n-type impurity dopant) from that of the semiconductor substrate 10, and may be provided with a well including the low concentration impurity diffusion region 46n and the high concentration impurity diffusion region 48n.

The arrangement of the contact plug 50, the via plug 52, and the upper wirings 51, 53 of the p-channel peripheral transistor is the same as that of the contact plug 50, the via plug 52, and the upper wirings 51, 53 of the n-channel peripheral transistor, and hence description thereof will be omitted.

An insulating film 55 is provided to cover all the components in the memory cell region 300a and the peripheral transistor region 300b on the insulating film 16. The insulating film 55 is formed, for example, of a silicon oxide film.

Referring to FIGS. 2 to 13, a manufacturing method of the DRAM 401 will be described.

Figure 2:
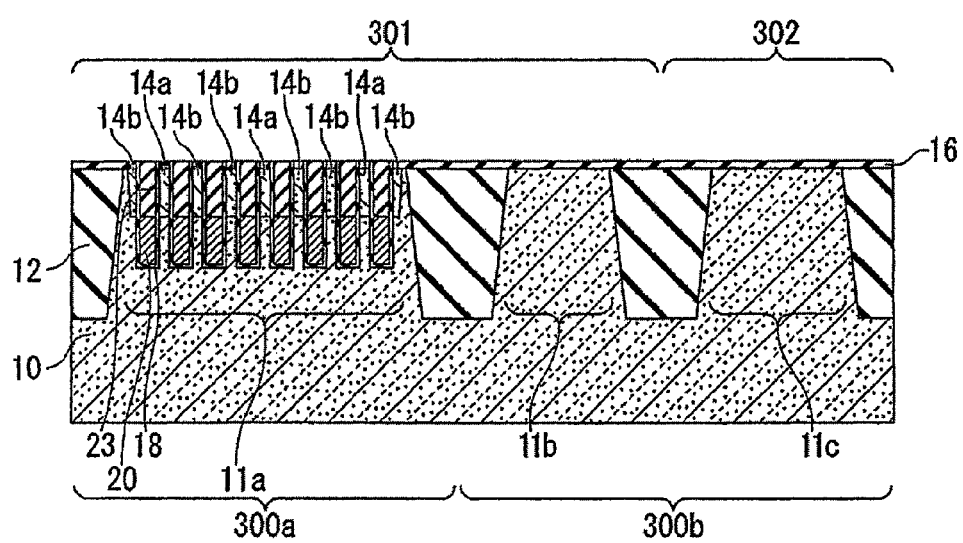
FIG. 2 is a cross-sectional view showing one manufacturing step of the semiconductor device according to the first embodiment of the invention.

Firstly, as shown in FIG. 2, a memory cell region 300a and a peripheral transistor region 300b are defined on the semiconductor substrate 10. Further, an n-channel region 301 and a p-channel region 302 are defined on the semiconductor substrate 10.

Subsequently, a plurality of STIs 12 are formed to define active regions 11a, 11b, 11c in the memory cell region 300a and peripheral transistor region 300b. Each of the STIs 12 can be formed, for example, by forming a trench in the semiconductor substrate 10 and then filling the trench with an insulating film such as a silicon oxide film by a CVD method.

Then, an insulating film 16 made of a silicon nitride film or the like is formed to cover the semiconductor substrate 10 and the STIs 12.

Subsequently, as shown in FIG. 2, embedded gate transistors for memory cells are formed in the active region 11a of the memory cell region 300a by the same processes as those of a conventional technique. Each embedded gate transistor comprises a gate insulating film 18, a gate electrode 20, an insulating film 23, and impurity diffusion regions 14a and 14b.

Figure 3:
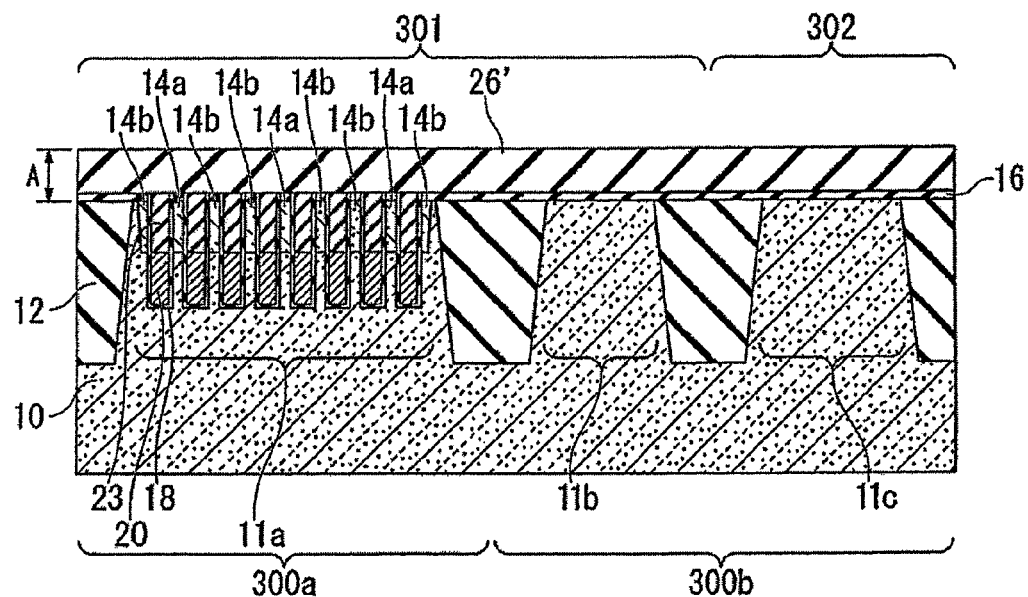
FIG. 3 is a cross-sectional view showing a manufacturing step following the step of FIG. 2.

Then, as shown in FIG. 3, a silicon oxide film 26' is formed on the structure shown in FIG. 2.

The height A from the semiconductor substrate 10 to the top face of the silicon oxide film 26' is smaller than the height from the semiconductor substrate 10 to a metal gate film to be formed later in the peripheral transistor region 300b. The height A of the top face of the silicon oxide film 26' is higher than the height of the top face of the upper gate film in the peripheral transistor region 300b.

Since the thicknesses of the metal gate film and the upper gate film in the peripheral transistor region 300b control the threshold voltage of the peripheral transistor, the silicon oxide film 26' is set to finally satisfy the aforementioned conditions in consideration of a threshold voltage of the peripheral transistor.

Figure 4:
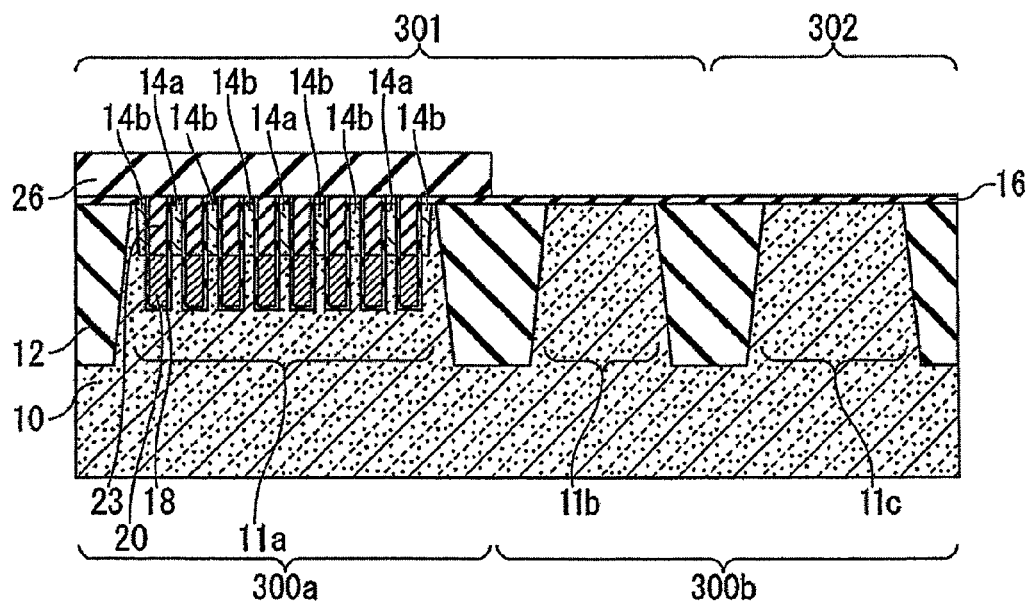
FIG. 4 is a cross-sectional view showing a manufacturing step following the step of FIG. 3.

Then, the silicon oxide film 26' in the peripheral transistor region 300b is removed by etching or the like. Thus, as shown in FIG. 4, a first interlayer insulating film 26 is formed on the embedded gate transistors for memory cells in the memory cell region 300a.

Figure 5:
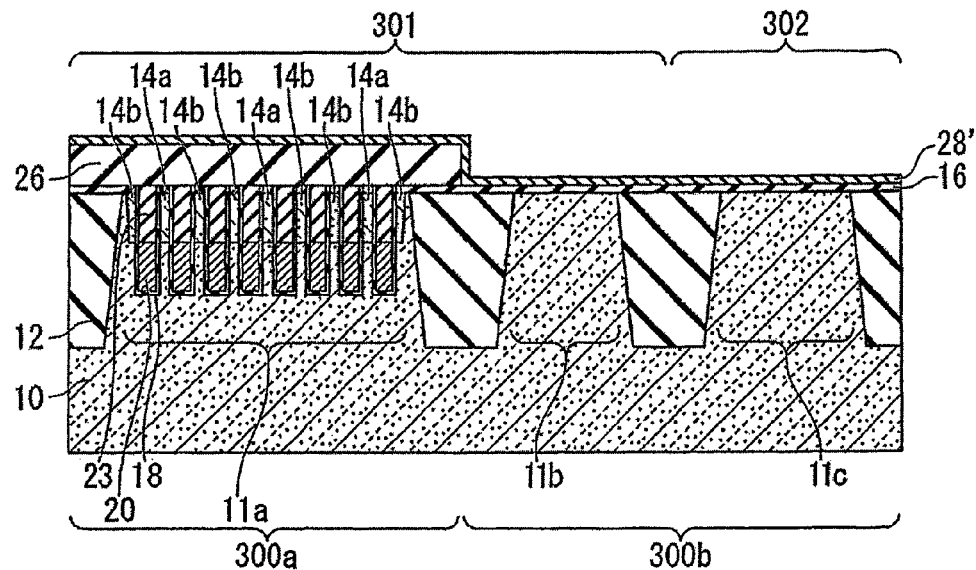
FIG. 5 is a cross-sectional view showing a manufacturing step following the step of FIG. 4.

As shown in FIG. 5, a high-k film 28' is formed to cover the first interlayer insulating film 26 and the insulating film 16 in the peripheral transistor region 300b. The high-k film 28' may be formed of a material having a relative dielectric constant of 7.0 or more (e.g. $Si_3N_4$ and $Al_2O_3$).

Figure 6:
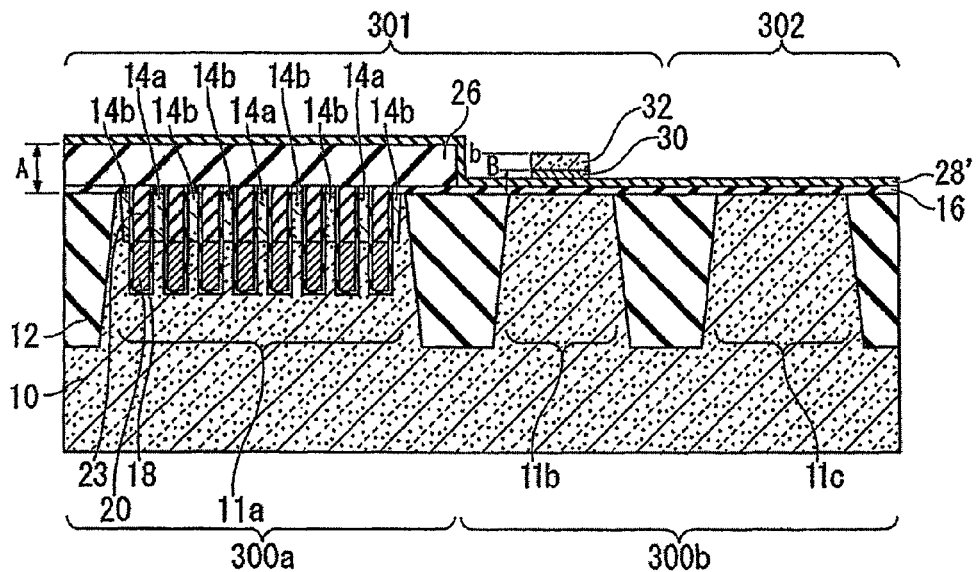
FIG. 6 is a cross-sectional view showing a manufacturing step following the step of FIG. 5.

Next, as shown in FIG. 6, a metal gate film 30 and an upper gate film 32 are sequentially stacked by patterning on the active region 11b in the peripheral transistor region 300b. The metal gate film 30 may be formed of a metal film (e.g. nickel film) that is selected in accordance with the high-k film 28'. The upper gate film 32 may be formed of a doped polysilicon film.

The thicknesses of the metal gate film 30 and the upper gate film 32 are determined respectively in consideration of a threshold voltage of the peripheral transistor. The height B from the semiconductor substrate 10 to the metal gate film 30 should be smaller than the height A from the semiconductor substrate 10 to the top face of the first interlayer insulating film 26. The height b of the top face of the upper gate film 32 is equal to or lower than the height A of the top face of the first interlayer insulating film 26.

Figure 7:
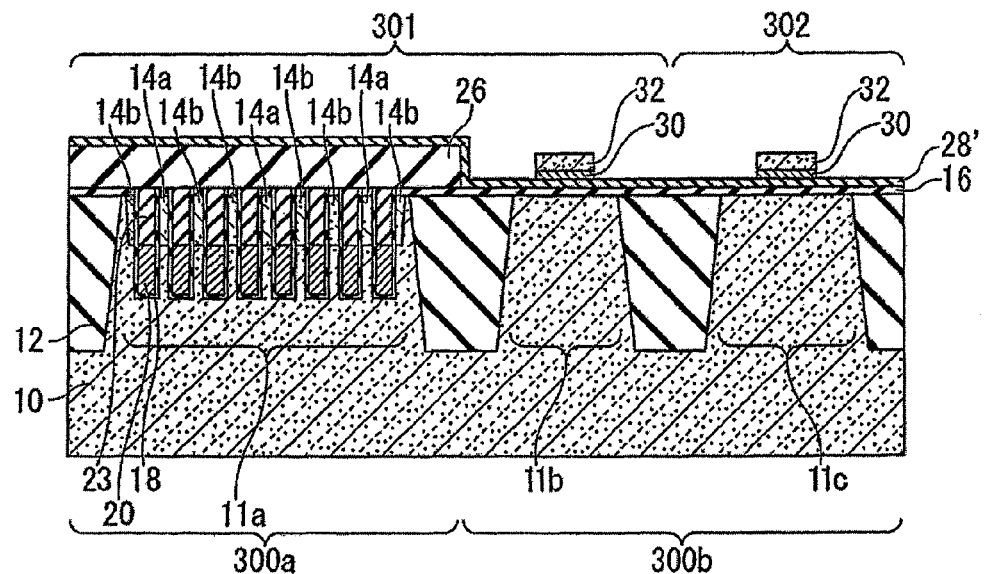
FIG. 7 is a cross-sectional view showing a manufacturing step following the step of FIG. 6.

Then, as shown in FIG. 7, a metal gate film 30 and an upper gate film 32 are sequentially stacked by patterning on the active region 11c in the peripheral transistor region 300b. The metal gate film 30 and the upper gate film 32 in the active region 11c may be formed of the same material as that of the metal gate film 30 and the upper gate film 32 in the active region 11b. The respective thicknesses of the metal gate film 30 and the upper gate film 32 in the active region 11c are the same as those of the metal gate film 30 and the upper gate film 32 in the active region 11b. The metal gate films 30 and the upper gate films 32 in the active regions 11b and 11c may be formed collectively.

Figure 8:
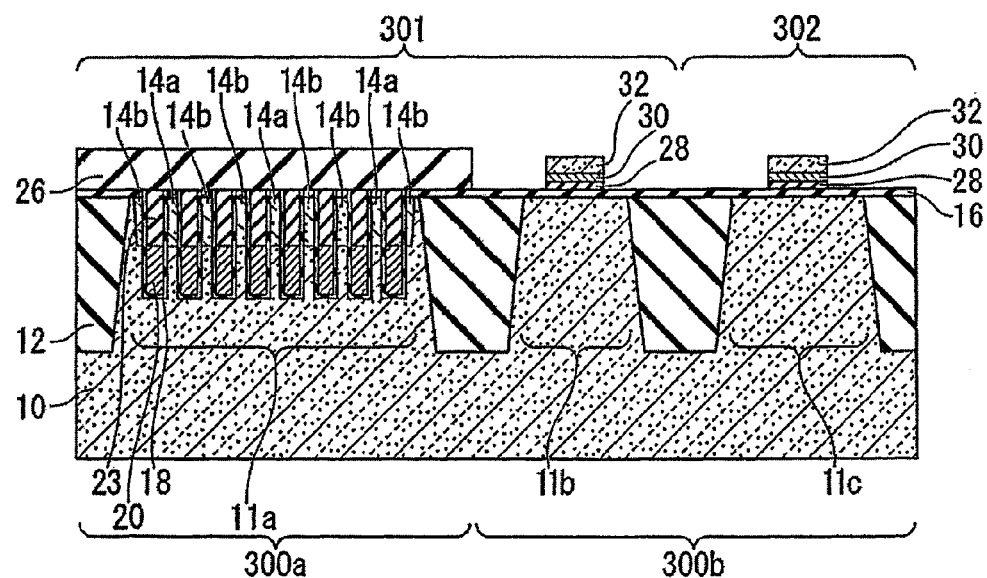
FIG. 8 is a cross-sectional view showing a manufacturing step following the step of FIG. 7.

Next, as shown in FIG. 8, the high-k film 28' is removed except the portions thereof covered by the metal gate film 30 in the peripheral transistor region 300b. Thus, gate insulating films 28 including a high-k film is formed on the active regions 11b and 11c in the peripheral transistor region 300b.

Figure 9:
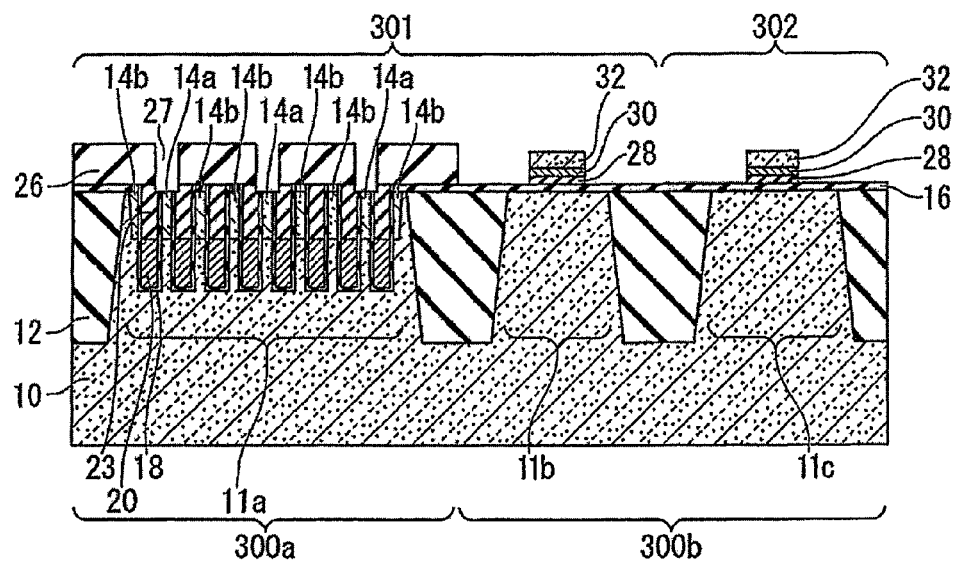
FIG. 9 is a cross-sectional view showing a manufacturing step following the step of FIG. 8.

As shown in FIG. 9, bit contact holes 27 are formed in the first interlayer insulating film 26 to be in contact with the respective impurity diffusion regions 14a. The bit contact holes 27 can be formed by lithography and etching, for example.

Figure 10:
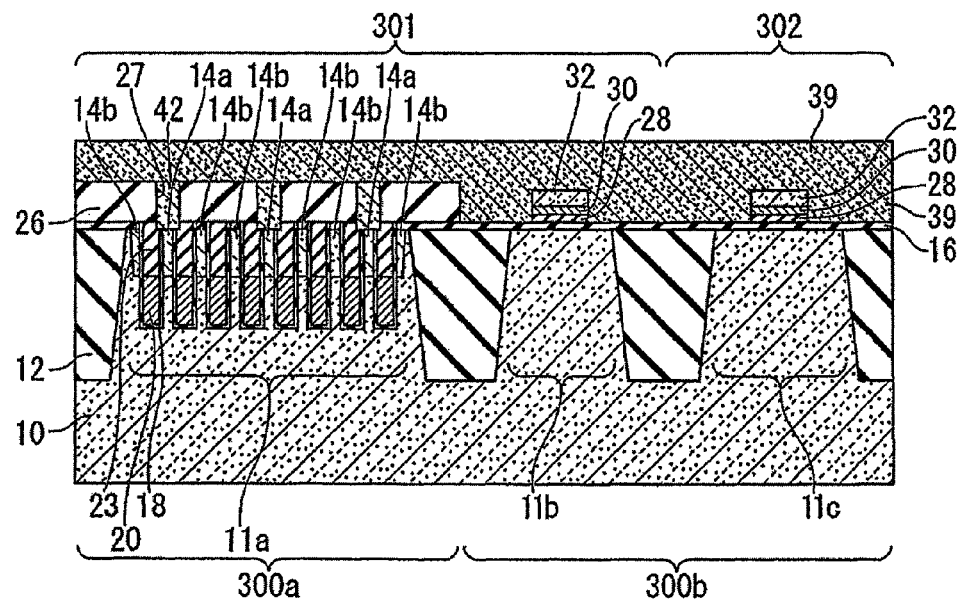
FIG. 10 is a cross-sectional view showing a manufacturing step of the semiconductor device following the step of FIG. 9.

Then, as shown in FIG. 10, a fifth conductor film 39 is formed to cover the first interlayer insulating film 26 while filling the bit contact holes 27, and to cover the upper gate film 32. The fifth conductor film 39 is formed of a material used for contact plugs or gate electrodes of peripheral transistors, for example, a doped polysilicon film.

Subsequently, the fifth conductor film 39 is removed downward from the top face thereof, by CMP or etching. As described above, the height A of the first interlayer insulating film 26 is equal to or higher than the height b of the top face of the upper gate film 32. Therefore, when the fifth conductor film 39 is removed downward from the top face thereof, the top face of the first interlayer insulating film 26 is exposed from the top face of the fifth conductor film 39 first (FIG. 11), or the top face of the first interlayer insulating film 26 and the top face of the upper gate film 32 are exposed simultaneously.

The CMP or etching of the fifth conductor film 39 is stopped at this point. In this manner, the fifth conductor film 39 is flattened until the top face of the first interlayer insulating film 26 and/or the top face of the upper gate film 32 is exposed.

As a result of the CMP or etching process described above, there are formed contact plugs 42 which are formed of a first conductor film of the same material as that of the fifth conductor film 39 and embedded in the bit contact holes 27 in the first interlayer insulating film 26.

Figure 11:
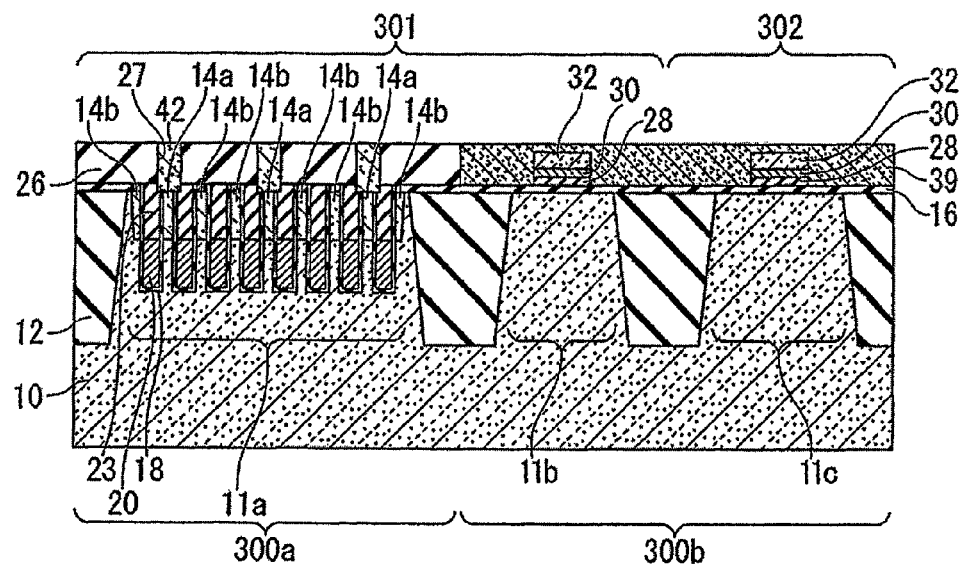
FIG. 11 is a cross-sectional view showing a manufacturing step following the step of FIG. 10.

When the height A of the first interlayer insulating film 26 is higher than the height b of the top face of the upper gate film 32 as shown in FIG. 11, the fifth conductor film 39 can be left unremoved on the upper gate film 32 in the peripheral transistor region 300b.

In this manner, the height position A of the top face of the first interlayer insulating film 26, the height position of the top faces of the contact plugs 42, and the height position of the top face of the fifth conductor film 39 or the upper gate film 32 in the peripheral transistor region 300b can be all aligned to the same height.

Figure 12:
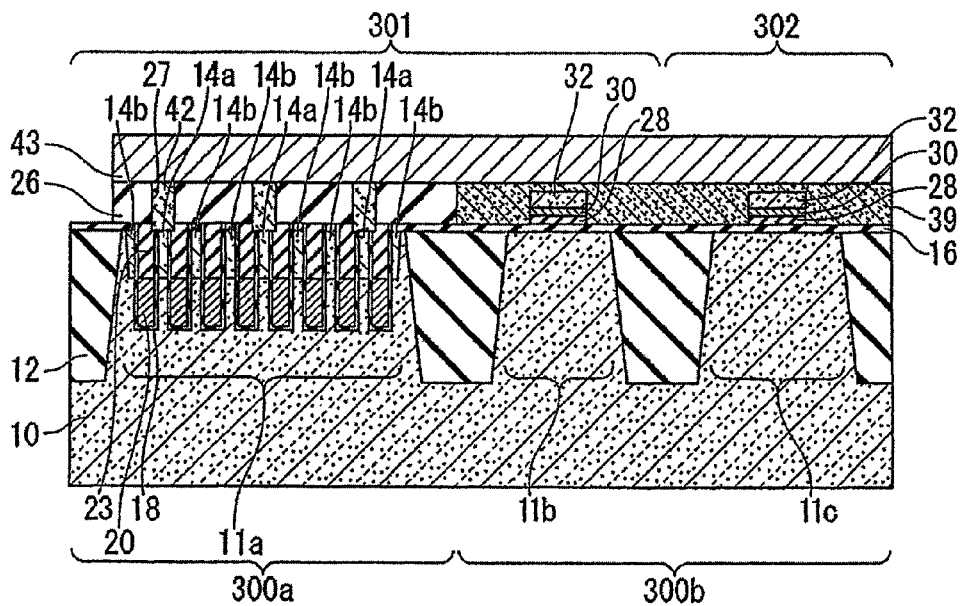
FIG. 12 is a cross-sectional view showing a manufacturing step following the step of FIG. 11.

Next, as shown in FIG. 12, a sixth conductor film 43 is stacked on the first interlayer insulating film 26 and the upper gate film 32. The sixth conductor film 43 is formed of a tungsten film or a material that is used for forming bit lines. The thickness of the sixth conductor film 43 is determined in consideration of the thickness of bit lines of the embedded gate transistors.

Then, the fifth conductor film 39 and the sixth conductor film 43 are removed by patterning, except the portions thereof locating on the first interlayer insulating film 26 and the upper gate film 32.

Since the height position A of the top face of the first interlayer insulating film 26, the height position of the top faces of the contact plugs 42, and the height position of the top face of the fifth conductor film 39 or the upper gate film 32 in the peripheral transistor region 300b are aligned to the same height, and the top face of the sixth conductor film 43 is flattened, patterning of the fifth conductor film 39 and the sixth conductor film 43 can be performed easily with high precision. In addition, the patterning of the fifth conductor film 39 and the sixth conductor film 43 in the memory cell region 300a and the peripheral transistor region 300b can be performed collectively.

Figure 13:
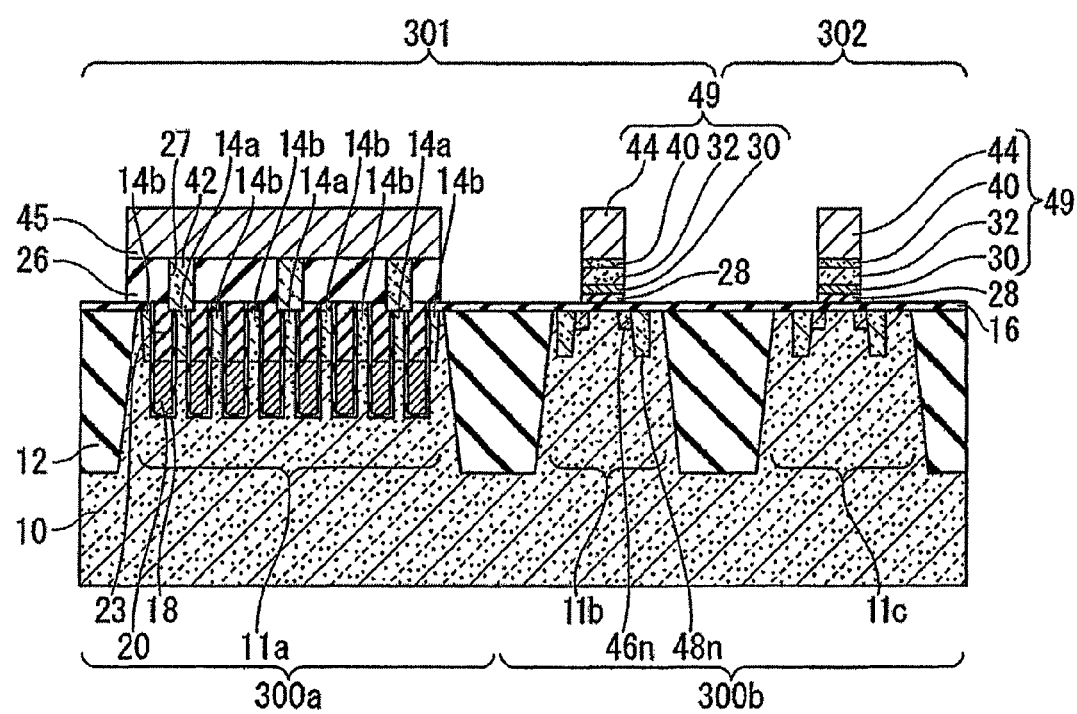
FIG. 13 is a cross-sectional view showing a manufacturing step following the step of FIG. 12.

As a result of this process, as shown in FIG. 13, a second conductor film 45 constituting a bit line connected to the contact plugs 42 is formed in the memory cell region 300a. In addition, a gate electrode stack 49 is formed on the gate insulating film 28 in the peripheral transistor region 300b. The gate electrode stack 49 has a metal gate film 30, an upper gate film 32, a fourth conductor film 40 formed by patterning the fifth conductor film 39, and a third conductor film 44 having the same thickness as the second conductor film 45 and formed by patterning the sixth conductor film 43.

The total thickness of the gate electrode stack 49 controls the threshold voltage of the peripheral transistor.

Therefore, the respective thicknesses of the metal gate film 30, the upper gate film 32, the fourth conductor film 40, and the third conductor film 44 are determined in consideration of the characteristics of the respective material and the threshold voltage of the peripheral transistor.

In this manner, the height A from the semiconductor substrate 10 to the top face of the first interlayer insulating film 26 is determined according to the total thickness of the gate insulating film 28, the metal gate film 30, the upper gate film 32, and the fourth conductor film 40. In the meantime, the height from the top face of the first interlayer insulating film 26 to the top face of the second conductor film 45 is determined according to the thickness of the third conductor film 44 that is determined in consideration of the thickness of the bit lines of the memory cells.

Next, low concentration impurity diffusion regions 46n containing an n-type impurity dopant are formed in the semiconductor substrate 10 on the widthwise opposite sides of the gate electrode stack 49 in the active region 11b. Further, high concentration impurity diffusion regions 48n containing an n-type impurity dopant are formed in the semiconductor substrate 10 adjacent to the low concentration impurity diffusion regions 46n on the sides closer to the STIs 12 by means of the same process but increasing the concentration of the n-type impurity dopant.

Alternatively, the n-type impurity dopant may be changed to a p-type impurity dopant and the same process as the formation of the low concentration impurity diffusion region 46n and the high concentration impurity diffusion region 48n may be performed in the active region 11c, so that low concentration impurity diffusion regions 46p and high concentration impurity diffusion regions 48p containing the p-type impurity dopant are formed in the semiconductor substrate 10 on the widthwise opposite sides of the gate electrode stack 49 in the active region 11c.

A well having an n-type impurity dopant and including the low concentration impurity diffusion regions 46p and the high concentration impurity diffusion regions 48p may be formed in the active region 11c.

Then, as shown in FIG. 1, capacitors 54 in the memory cell region 300a, contact plugs 50, via plugs 52, and upper wirings 51, 53 in the peripheral transistor region 300b, and an insulating film 55 are formed by a known method. A DRAM 401 is thus completed.

According to the manufacturing method of a semiconductor device according to the first embodiment, the height B from the semiconductor substrate 10 to the top face of the metal gate film 30 is smaller than the height A from the semiconductor substrate 10 to the top face of the first interlayer insulating film 26, and the height b of the top face of the upper gate film 32 is equal to or lower than the height A of the top face of the first interlayer insulating film 26.

This makes it possible to form the contact plugs 42, the second conductor film 45, and the gate electrode stack 49 collectively in the memory cell region 300a and the peripheral transistor region 300b. In this process, the first interlayer insulating film 26 or the upper gate film 32 functions as a CMP stopper, or an index for determining etching endpoint.

Thus, when the fifth conductor film 39 is processed, the fifth conductor film 39 can be flattened until the top face of the first interlayer insulating film 26 or the top face of the upper gate film 32 is exposed, so that the height of the top face of the upper gate film 32 is made equal to or lower than the height of the top face of the fifth conductor film 39 after completion of the processing. Therefore, damage to or loss of the metal gate film 30 and the upper gate film 32 can be prevented reliably.

Further, the uniformity of the DRAM 401 can be improved since the control of the CMP or etching is made easy during formation of the contact plugs 42, the second conductor film 45, and the gate electrode stack 49. This facilitates the gate etching processing, which improves the yield of semiconductor device.

Furthermore, at the completion of formation of the contact plugs 42, the top face of the first interlayer insulating film 26, the top faces of the contact plugs 42, and the top face b of the fourth conductor film 40 or the upper gate film 32 can be aligned at the same position. Therefore, the manufacturing steps of the semiconductor device after the formation of the contact plugs 42, the second conductor film 45 and the gate electrode stack 49 in the memory cell region 300a and the peripheral transistor region 300b can be performed collectively and easily.

(Second Embodiment)

A DRAM (semiconductor device) 402 according to a second embodiment of the invention and a manufacturing method thereof will be described with reference to FIGS. 14 and 15.

Figure 14:
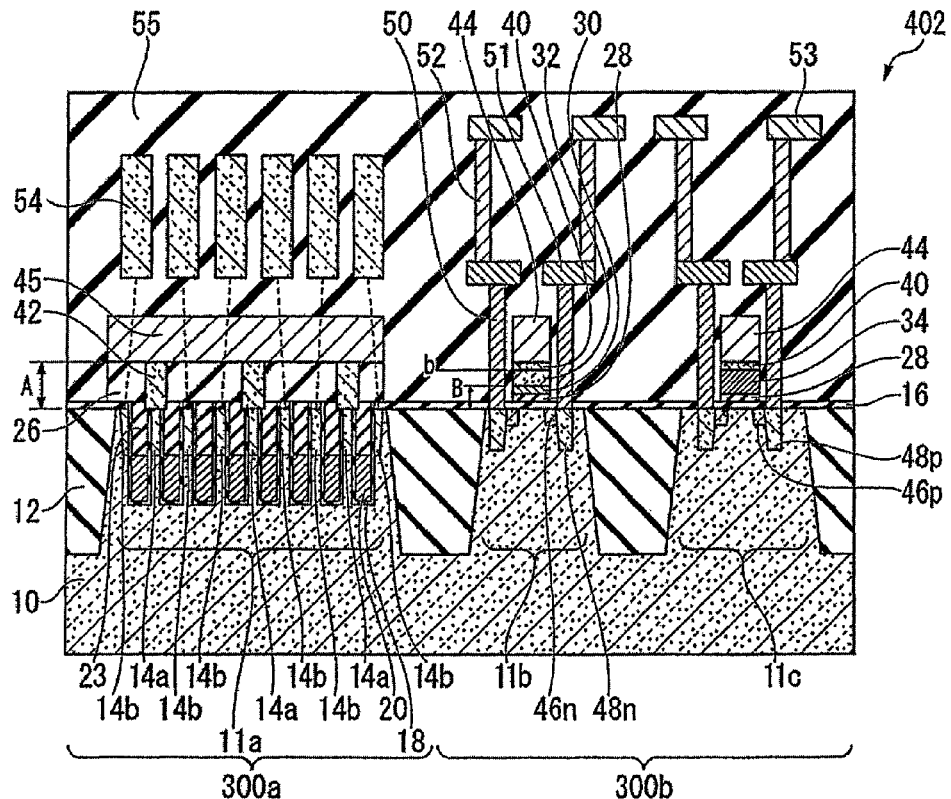
FIG. 14 is a cross-sectional view showing a configuration of a semiconductor device according to a second embodiment of the invention.

Referring to FIG. 14, a configuration of the DRAM 402 will be described. In FIG. 14, like components of the DRAM 402 to those of the DRAM 401 shown in FIG. 1 will be indicated by the same reference numerals and description thereof will be omitted.

The gate electrode stack 49 of the peripheral transistor does not necessarily require to include a polysilicon film or doped polysilicon film. The DRAM 402 has, as shown in FIG. 14, a configuration in which the metal gate film 30 and the upper gate film 32 formed of a polysilicon film or doped polysilicon film, formed in the p-channel region 302 in the peripheral transistor region 300b of the DRAM 401 are replaced with another metal gate film 34.

This another metal gate film 34 has the same thickness as the total thickness of the metal gate film 30 and the upper gate film 32 formed in the n-channel region 301 in the peripheral transistor region 300b. The thickness of the metal gate film 34 is determined in consideration of a threshold voltage of the p-channel peripheral transistor. The another metal gate film 34 is formed of a metal film such as a nickel film.

The configuration of the DRAM 402 according to the second embodiment is not limited to the configuration shown in FIG. 14 in which the another metal gate film 34 is used only in the p-channel peripheral transistor. Specifically, the DRAM 402 according to the second embodiment may have a configuration in which only the metal gate film 30 and upper gate film 32 formed in the n-channel peripheral transistor are replaced with another metal gate film 34, or the metal gate film 30 and upper gate film 32 formed in every peripheral transistor are replaced with a metal gate film 34.

A manufacturing method of the DRAM 402 will be described with reference to FIG. 15. In the description of the manufacturing method of the DRAM 402, description of the same steps as those in the manufacturing method of the DRAM 401 will be omitted.

In the manufacture of the DRAM 402, the same steps as those in the manufacturing method of the DRAM 401 shown in FIGS. 1 to 6 are firstly performed, whereby a structure as shown in FIG. 6 is obtained.

Figure 15:
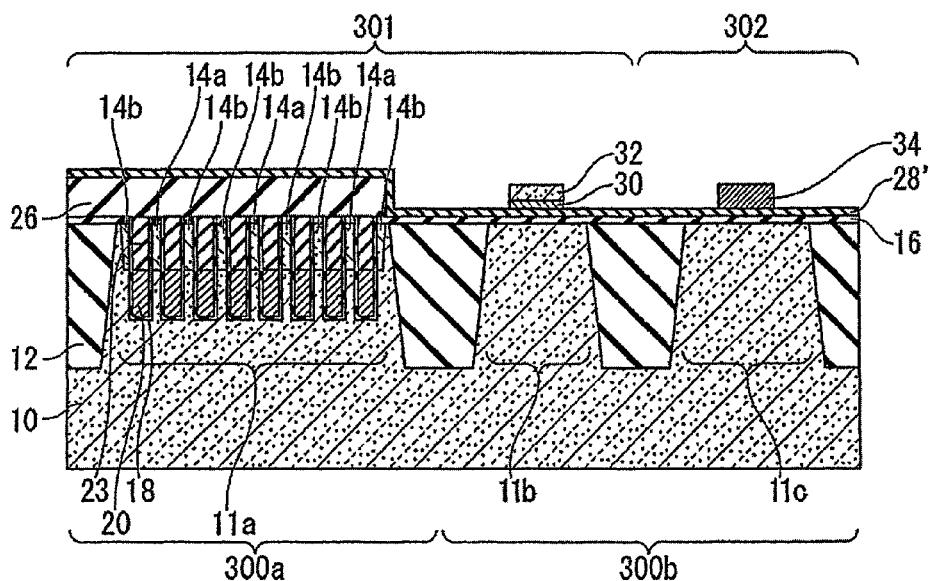
FIG. 15 is a cross-sectional view showing one manufacturing step of the semiconductor device according to the second embodiment of the invention.

Next, as shown in FIG. 15, a metal gate film 34 having the same thickness as the total thickness of the metal gate film 30 and the upper gate film 32 formed in the active region 11b is formed on a high-k film 28' in the active region 11c in the peripheral transistor region 300b. The height of the top face of the upper gate film 32 in the active region 11b is the same as the height of the top face of the metal gate film 34 in the active region 11c.

The metal gate film 34 can be formed of a metal film such as a nickel film.

The metal gate film 34 can be formed, for example, by lithography and etching.

The same steps as those after the step shown in FIG. 8 in the manufacturing method of the DRAM 401 are then performed while the metal gate film 30 and the upper gate film 32 formed in the active region 11c in the peripheral transistor region 300b (FIG. 8) are replaced with the metal gate film 34.

In the step shown in FIGS. 10 and 11 in which the metal gate film 30 and the upper gate film 32 formed in the active region 11c (FIG. 8) are replaced with the metal gate film 34, the top face of the first interlayer insulating film 26 or the top face of the first interlayer insulating film 26 as well as the top face of the upper gate film 32 and the top face of the metal gate film 34 are exposed from the top face of the fifth conductor film 39 when the fifth conductor film 39 is removed downward from the top face thereof by CMP or etching. At this point, the CMP or etching of the fifth conductor film 39 is stopped.

As a result of these steps, the DRAM 402 shown in FIG. 14 is completed.

According to the manufacturing method of a semiconductor device according to the second embodiment, a metal gate film 34 is formed between the gate insulating film 28 and the third conductor film 44 in the active region 11c in the peripheral transistor region 300b, such that the height of the top face of the metal gate film 34 is the same as the height of the top face of the first interlayer insulating film 26 and the upper gate film 32 in the active region 11b.

In this manner, the number of manufacturing steps of the DRAM can be reduced, and as shown in FIG. 14, the height B from the semiconductor substrate 10 to the top face of the metal gate film 30 can be made smaller than the height A from the semiconductor substrate 10 to the top face of the first interlayer insulating film 26, and the height b of the top face of the upper gate film 32 and the metal gate film 34 can be made equal to or lower than the height A of the top face of the first interlayer insulating film 26.

Therefore, during the formation of the contact plugs 42, the second conductor film 45 and the gate electrode stack 49, the first interlayer insulating film 26 or the upper gate film 32 or the metal gate film 34 functions as a CMP stopper or an index for determining the etching endpoint.

Thus, when the fifth conductor film 39 is flattened until the top face of the first interlayer insulating film 26 or the top face of the upper gate film 32 or the top face of the metal gate film 34 is exposed in the processing of the fifth conductor film 39, the height of the upper gate film 32 and the height of the top face of the metal gate film 34 becomes equal to or lower than the height of the top face of the fifth conductor film 39 after completion of the processing. Therefore, the damage to or loss of the metal gate film 30, the upper gate film 32, and the metal gate film 34 can be prevented reliably.

This means that, according to the manufacturing method of a semiconductor device according to the second embodiment, the same effects as those of the manufacturing method of a semiconductor device according to the first embodiment can be obtained regardless of what material is used for the gate electrode stack 49 of the peripheral transistor.

(Third Embodiment)

Next, a DRAM (semiconductor device) 403 (not shown in the drawings) according to a third embodiment of the invention and a manufacturing method thereof will be described with reference to FIGS. 16 and 17.

The DRAM 403 has a configuration in which the upper gate film 32 in the peripheral transistor region 300b of the DRAM 401 is replaced with a hard mask film 62, a seventh conductor film 60 is arranged between the metal gate film 30 and the hard mask film 62, and the third conductor film 44 is removed. The seventh conductor film 60 is formed of a doped silicon film.

A manufacturing method of the DRAM 403 will be described.

Figure 16:
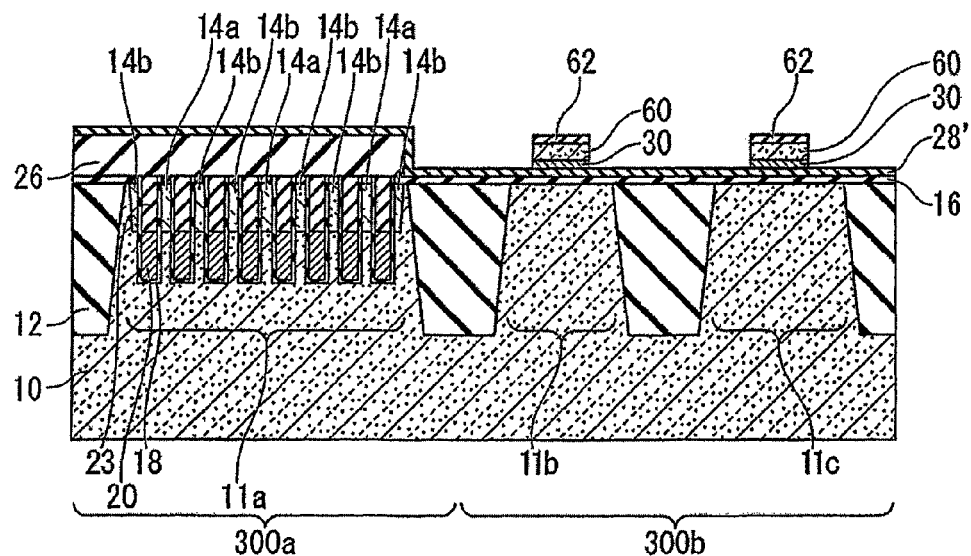
FIG. 16 is a cross-sectional view showing a manufacturing step following the step of FIG. 15.
Figure 17:
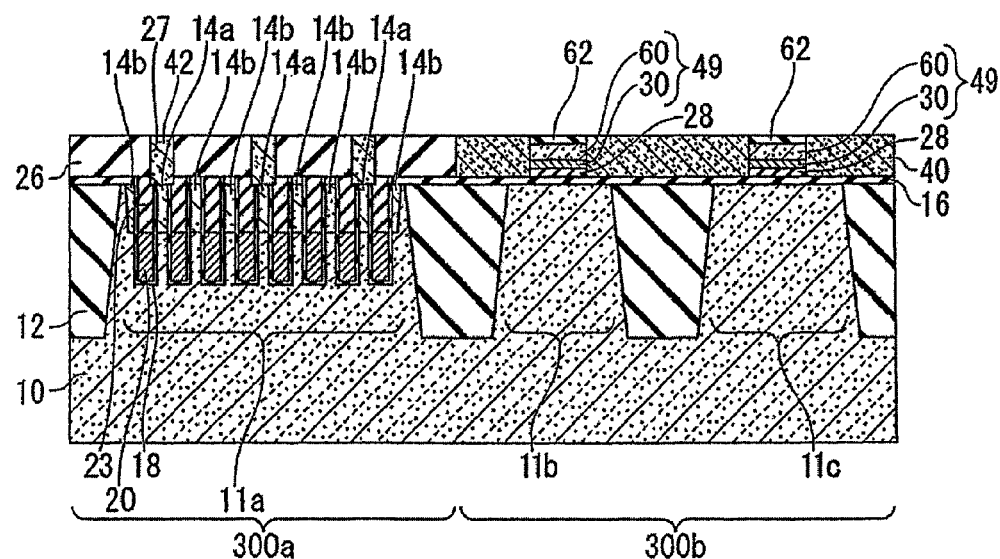
FIG. 17 is a cross-sectional view showing a manufacturing step following the step of FIG. 16.
Figure 18:
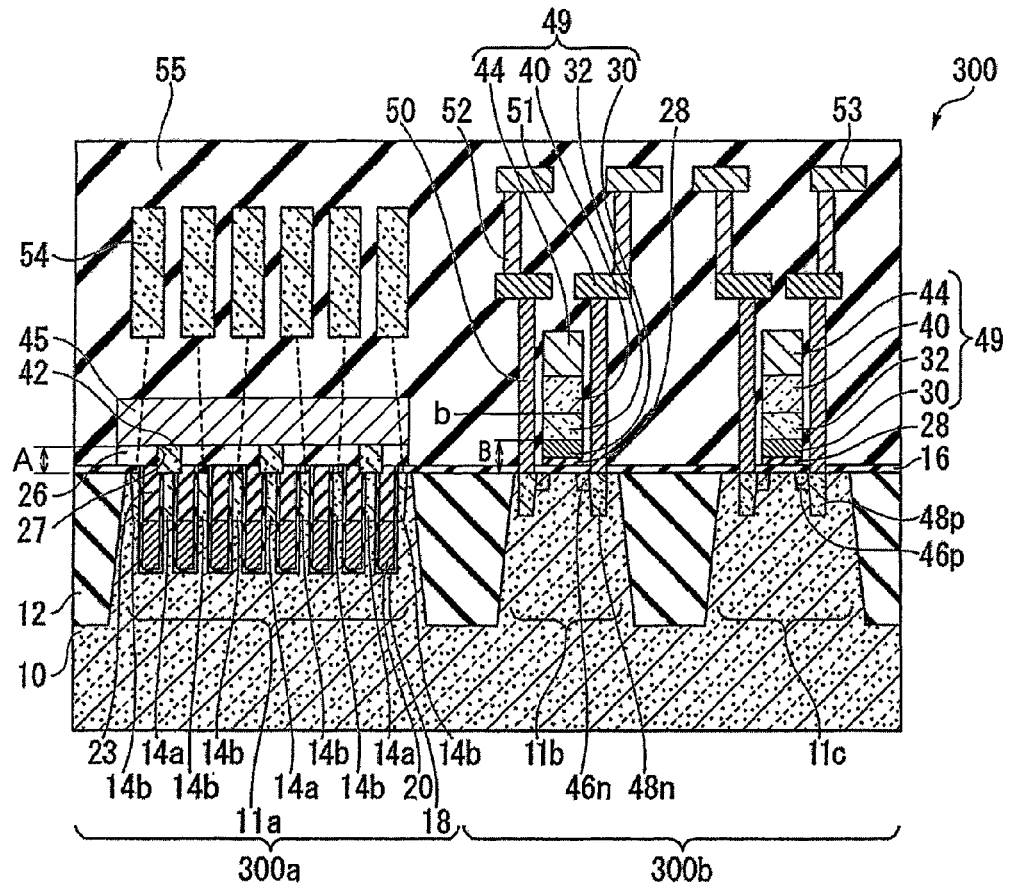
FIG. 18 is a cross-sectional view showing a configuration of a known semiconductor device.
Figure 19:
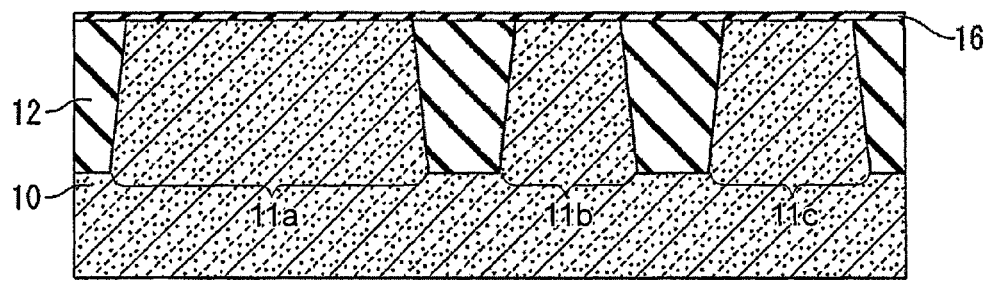
FIG. 19 is a cross-sectional view showing one manufacturing step of the semiconductor device shown in FIG. 18.
Figure 20:
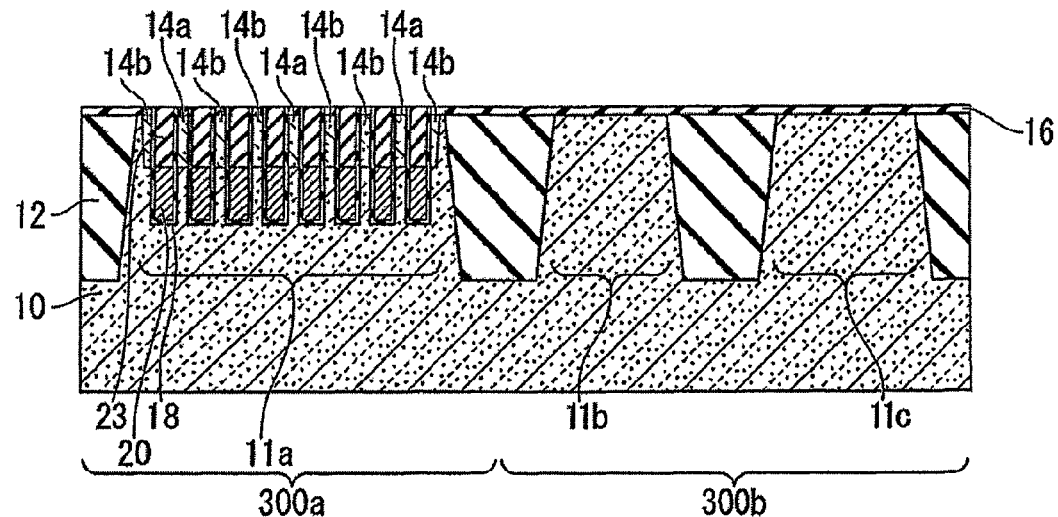
FIG. 20 is a cross-sectional view showing a manufacturing step following the step of FIG. 19.
Figure 21:
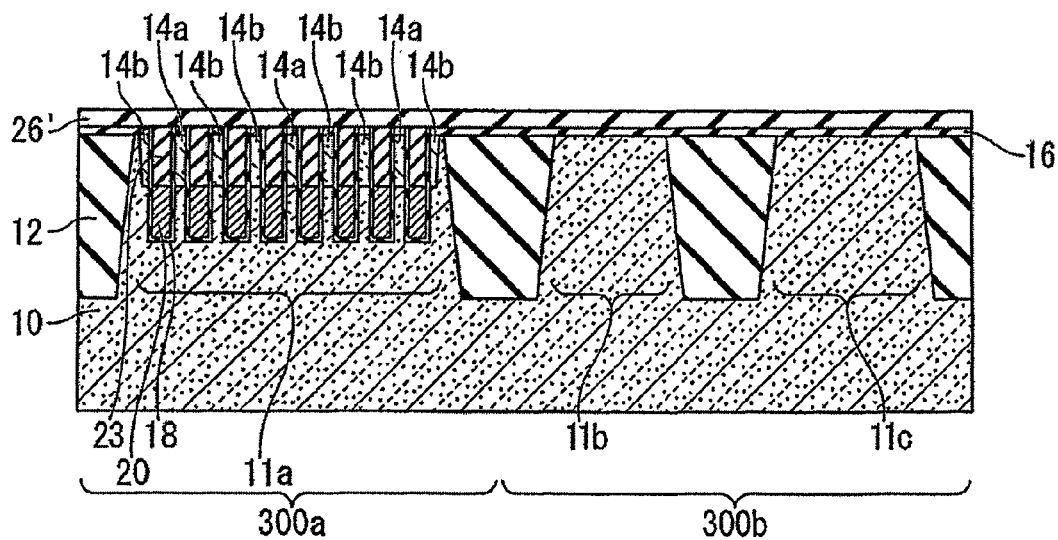
FIG. 21 is a cross-sectional view showing a manufacturing step following the step of FIG. 20.
Figure 22:
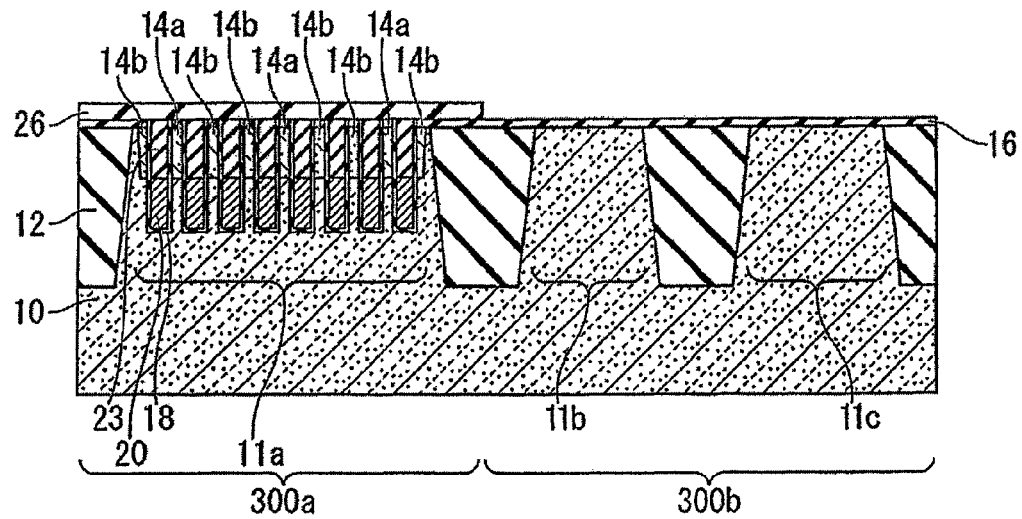
FIG. 22 is a cross-sectional view showing a manufacturing step following the step of FIG. 21.
Figure 23:
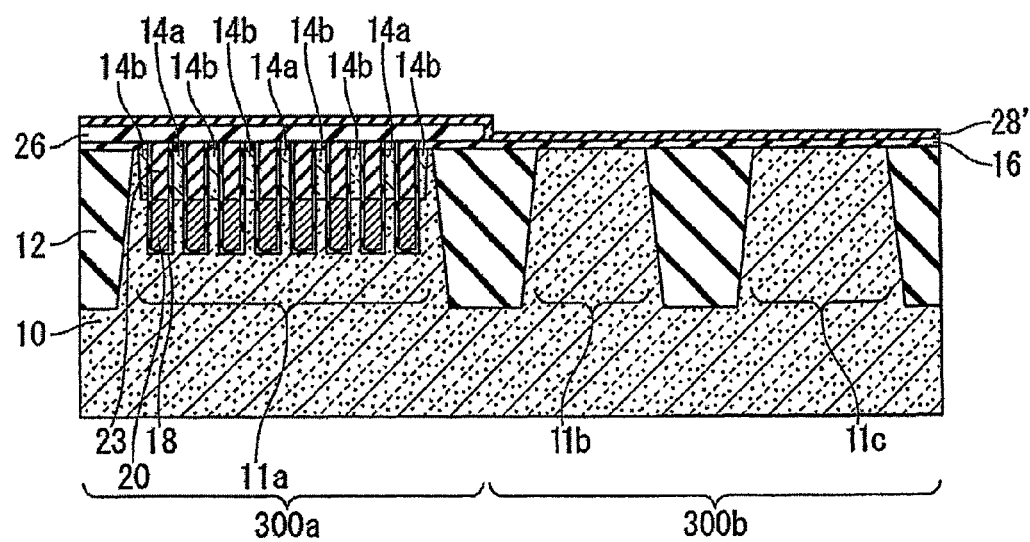
FIG. 23 is a cross-sectional view showing a manufacturing step following the step of FIG. 22.
Figure 24:
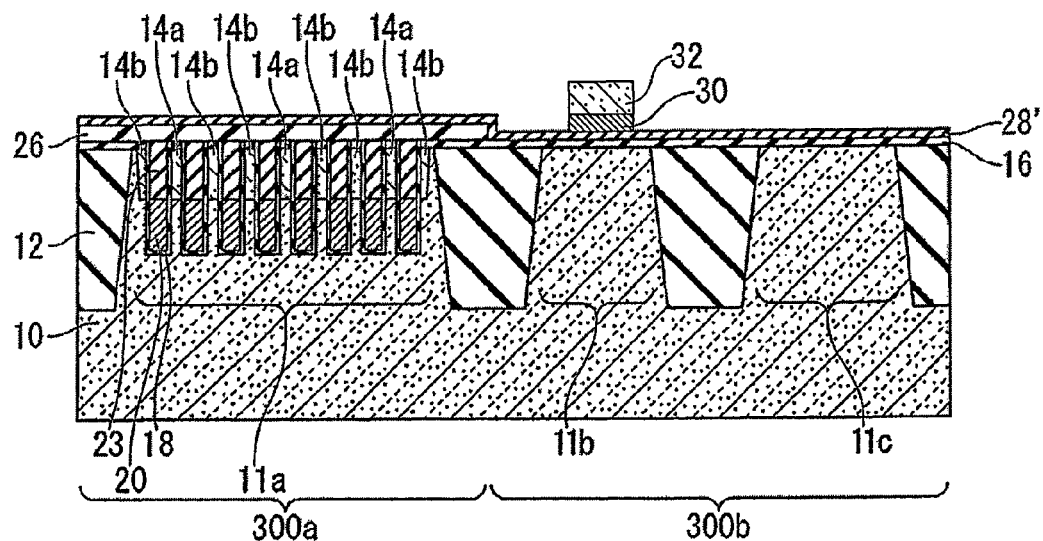
FIG. 24 is a cross-sectional view showing a manufacturing step following the step of FIG. 23.
Figure 25:
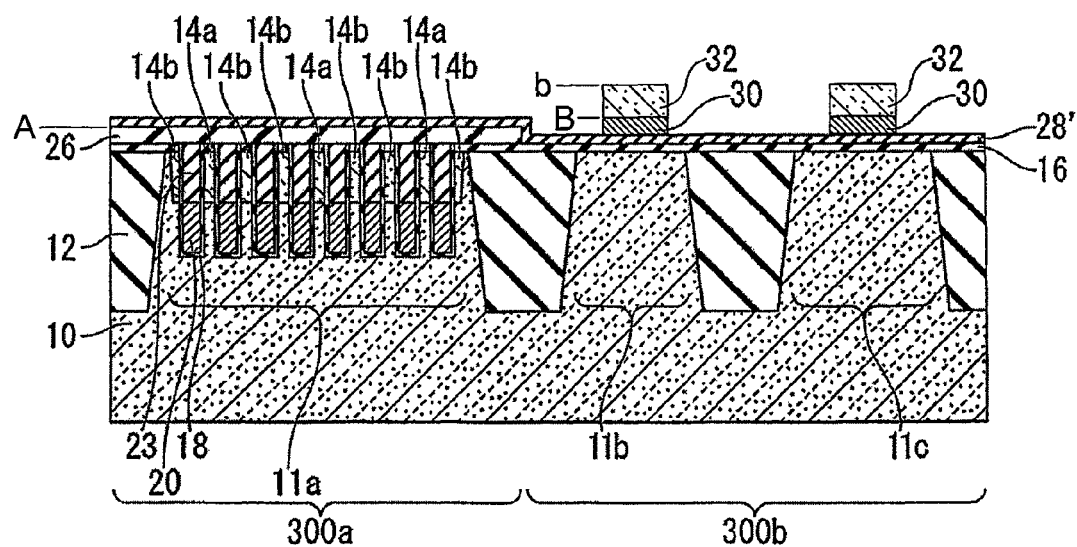
FIG. 25 is a cross-sectional view showing a manufacturing step following the step of FIG. 24.
Figure 26:
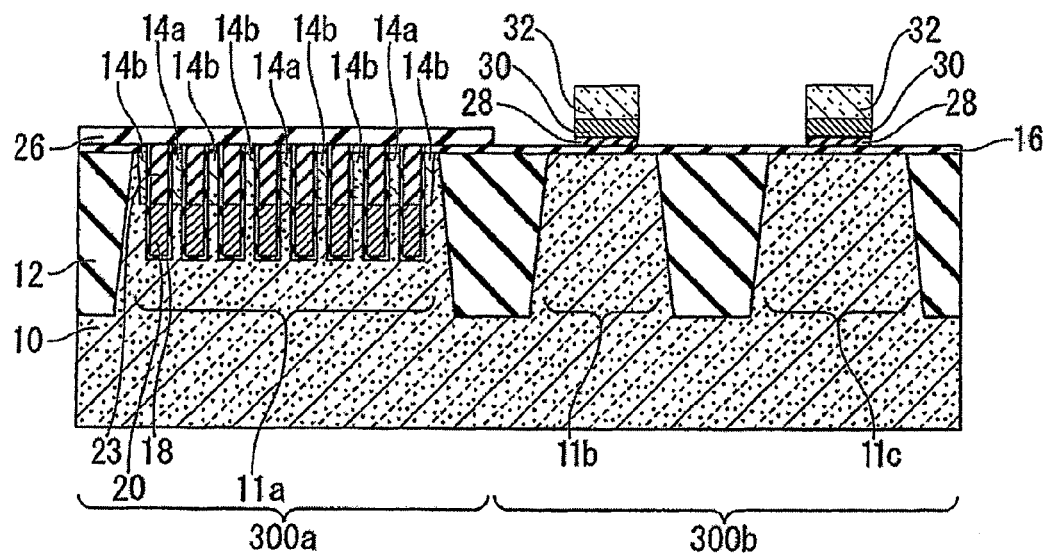
FIG. 26 is a cross-sectional view showing a manufacturing step following the step of FIG. 25.
Figure 27:
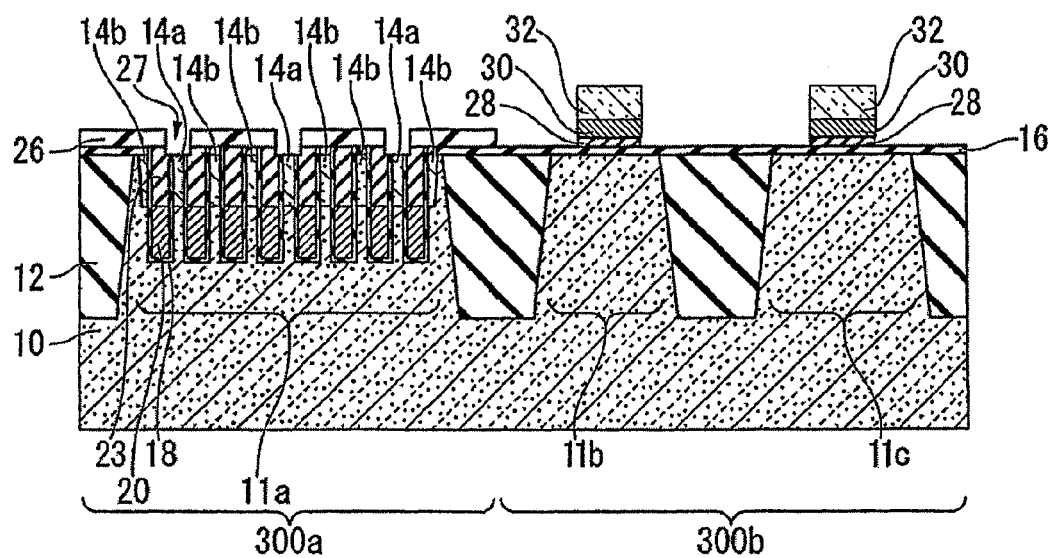
FIG. 27 is a cross-sectional view showing a manufacturing step following the step of FIG. 26.
Figure 28:
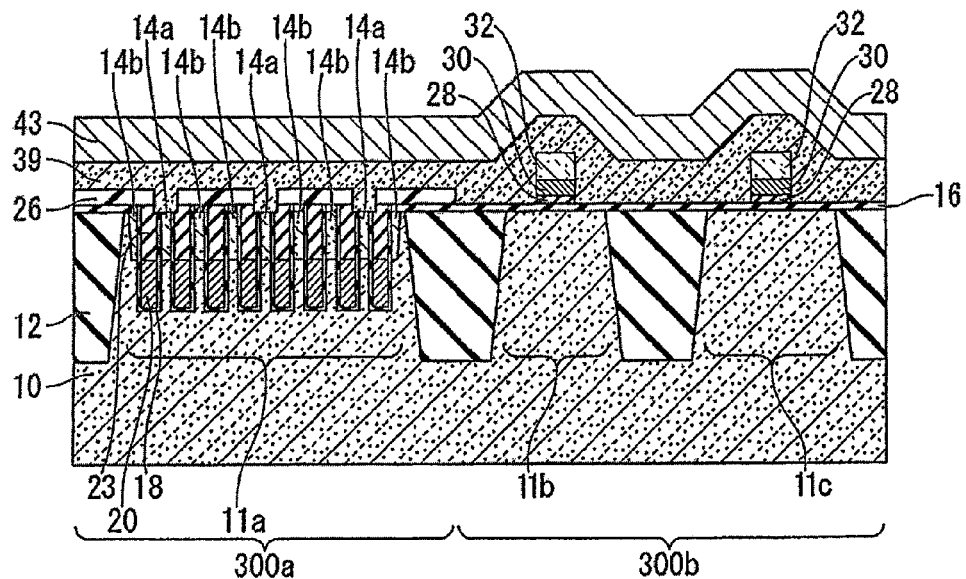
FIG. 28 is a cross-sectional view showing a manufacturing step following the step of FIG. 27.
Figure 29:
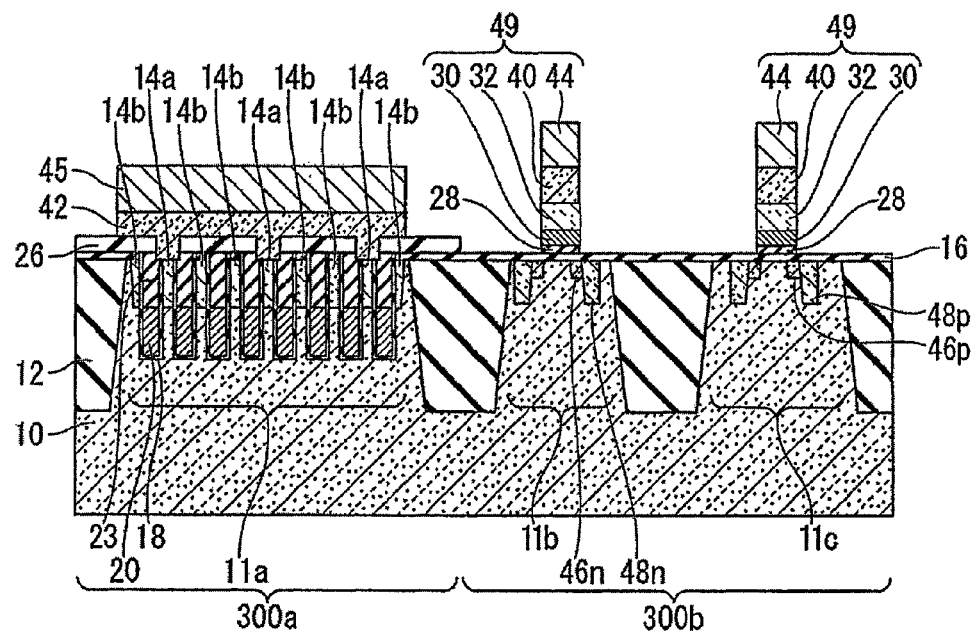
FIG. 29 is a cross-sectional view showing a manufacturing step following the step of FIG. 28.

Like components of the DRAM 403 shown in FIGS. 16 and 17 to those of the DRAM 401 shown in FIG. 1 are indicated by the same reference numerals, and description thereof will be omitted. Specifically, the configuration of the DRAM 403 according to the third embodiment is the same as that of the DRAM 401 according to the first embodiment except for the layered structure of the seventh conductor film 60 and the hard mask film 62 in the peripheral transistor region 300b. Therefore, in the description of the manufacturing method of the DRAM 403, description of the same steps as those of the manufacturing method of the DRAM 401 will be omitted.

In the manufacture of the DRAM 403, the same steps as those of the manufacturing method of the DRAM 401 shown in FIGS. 1 to 5 are firstly performed, whereby a structure as shown in FIG. 5 is obtained.

Then, as shown in FIG. 16, a metal gate film 30, a seventh conductor film 60, and a hard mask film 62 as an upper gate film are sequentially stacked by patterning on the high-k film 28' in the active regions 11b and 11c in the peripheral transistor region 300b. The seventh conductor film 60 may be formed of a doped polysilicon film. The hard mask film 62 may be formed of a silicon nitride film, for example. The thickness of the seventh conductor film 60 is determined in consideration of a threshold voltage of the peripheral transistor.

In this process step, the height of the top face of the hard mask film 62 is made equal to the height of the top face of the first interlayer insulating film 26.

After this, the same process steps as those following the step shown in FIG. 8 in the manufacturing method of the DRAM 401 are performed while replacing the upper gate film 32 (FIG. 8) in the peripheral transistor region 300b with the hard mask film 62.

In the process step shown in FIG. 13, when manufacturing the DRAM 403, the sixth conductor film 43 on the hard mask film 62 is also removed. A gate electrode stack 49 composed of a metal gate film 30 and a seventh conductor film 60 is formed on the gate insulating film 28 in the peripheral transistor region 300b.

According to the manufacturing method of a semiconductor device according to the third embodiment, the hard mask film 62 the top face of which is at a height equal to or lower than the height A of the top face of the first interlayer insulating film 26 is formed on the gate insulating film 28 in the active region 11c in the peripheral transistor region 300b. Additionally, the seventh conductor film 60 is formed between the metal gate film 30 and the hard mask film 62.

Thus, when the fifth conductor film 39 is flattened by CMP, the first interlayer insulating film 26 or the hard mask film 62 functions as a CMP stopper.

As a result, when the fifth conductor film 39 is flattened in the processing of the fifth conductor film 39 until the top face of the first interlayer insulating film 26 or the top face of the hard mask film 62 is exposed as shown in FIG. 17, the height of the top face of the hard mask film 62 becomes equal to the height of the top face of the fifth conductor film 39 after completion of the processing, which makes it possible to reliably prevent the damage to or loss of the metal gate film 30, the seventh conductor film 60, and the hard mask film 62.

Further, the top face of the first interlayer insulating film 26, the top faces of the contact plugs 42, and the top face of the hard mask film 62 can be aligned at the same position at completion of formation of the contact plugs 42. Therefore, the manufacturing steps of the semiconductor device after the formation of the second conductor film 45 and the gate electrode stack 49 in the memory cell region 300a and the peripheral transistor region 300b can be carried out easily.

This means that the manufacturing method of a semiconductor device according to the third embodiment is able to provide the same advantageous effects as those of the manufacturing method of a semiconductor device according to the first embodiment even when the hard mask film 62 is left unremoved on the peripheral transistor region 300b.

Although in the foregoing description of the embodiments, the metal gate film 30 is referred to as the first conductor layer, the upper gate film 32 is referred to as the second conductor layer, the fourth conductor film 40 is referred to as the third conductor layer, the second conductor film 45 is referred to as the fourth conductor layer, and the third conductor film 44 is referred to as the fifth conductor layer, the metal gate film 30 may be referred to as a first metal layer. In this case, the upper gate film 32 and the fourth conductor film 40 can be combined together and referred to as a first conductor layer, the second conductor film 45 can be referred to as a second conductor layer, and the third conductor film 44 can be referred as a third conductor layer.

While the invention has been described based on several exemplary embodiments thereof, the invention is not limited to these embodiments. The configuration and details of the invention can be changed or modified in various manners by those skilled in the art within the spirit and scope of the invention described in the claims.

For example, although the invention has been described on the assumption that it is a DRAM as an example of semiconductor devices, the invention is applicable to semiconductor devices other than a DRAM as well.

Some or all of the above-described exemplary embodiments can be described as in the following notes. Nevertheless, the invention is not limited to those notes.

(Note 1)

A manufacturing method of a semiconductor device comprising:

defining a memory cell region and a peripheral transistor region on a semiconductor substrate;

forming a memory cell including an embedded gate transistor for memory cell in the memory cell region;

forming a first interlayer insulating film on the memory cell;

forming a gate insulating film including a high-k film on the semiconductor substrate in the peripheral transistor region;

forming, on the gate insulating film in the peripheral transistor region, a metal gate film the top face of which has a height lower than a height of the top face of the first interlayer insulating film, while forming an upper gate film the top face of which has a height equal to or lower than a height of the top face of the first interlayer insulating film;

forming a bit contact hole in the first interlayer insulating film;

stacking a fifth conductor film to cover the first interlayer insulating film so as to fill the bit contact hole and to cover the upper gate film;

flattening the fifth conductor film until the top face of the first interlayer insulating film or the top face of the upper gate film is exposed, and forming a first conductor film as a contact plug embedded in the contact plug;

stacking a sixth conductor film on the first interlayer insulating film and the upper gate film; and forming a second conductor film constituting a bit line connected to the contact plug in the memory cell region by patterning the sixth conductor film, while forming, in the peripheral transistor region, a gate electrode stack including the metal gate film, the upper gate film, and a third conductor film formed by patterning the sixth conductor film.

(Note 2)

The manufacturing method of a semiconductor device according to Note 1, wherein:

in the step of forming the metal gate film and the upper gate film, the upper gate film is formed of doped polysilicon and such that the position of the top face thereof is lower than the position of the top face of the first interlayer insulating film;

in the step of forming the first conductor film, the fifth conductor film is flattened until the top face of the first interlayer insulating film is exposed, and a fourth conductor film is formed on the upper gate film;

in the step of the second conductor film and the gate electrode stack, the third conductor film is formed on the fourth conductor film.

(Note 3)

The manufacturing method of a semiconductor device according to Note 1 or 2, wherein:

in the step of forming the metal gate film and the upper gate film, another metal gate film is formed on the gate insulating film, the another metal gate film having the same thickness as the total thickness of the metal gate film and the upper gate film; and in the step of forming the fifth conductor film, the fifth conductor film is stacked to cover the first interlayer insulating film so as to fill the bit contact hole, and to cover the other metal gate film.

(Note 4)

The manufacturing method of a semiconductor device according to any one of Notes 1 to 3, wherein in the step of forming the metal gate film and the upper gate film, a hard mask film is formed as the upper gate film such that the position of the top face of the upper gate film is the same as the position of the top face of the first interlayer insulating film.

(Note 5)

The manufacturing method of a semiconductor device according to any one of Notes 1 to 4, wherein in the step of forming the metal gate film and the upper gate film, a seventh conductor film consisting of a doped polysilicon film is formed between the metal gate film and the upper gate film.

What is claimed is:

1. A semiconductor device comprising:
a semiconductor substrate including a memory cell region and a peripheral transistor region;
the memory cell region comprising:
an embedded gate transistor for memory cell;
a first interlayer insulating film having a bit contact hole;
a contact plug formed of a first conductor film embedded in the bit contact hole; and
a second conductor film which is stacked on the first interlayer insulating film to constitute a bit line connected to the contact plug; and
the peripheral transistor region comprising:
a peripheral transistor having a gate insulating film including a high-k film;
a gate electrode stack formed on the gate insulating film, the gate electrode stack being provided at least with a metal gate film formed on the gate insulating film, an upper gate film stacked on the metal gate film, and a third conductor film stacked on the upper gate film, the third conductor film being formed of the same material and having the same thickness as the second conductor film; and
a fourth conductor film provided between the upper gate film and the third conductor film,
wherein a height from the semiconductor substrate to a top face of the upper gate film is equal to or lower than a height of a top face of the first interlayer insulating film,
wherein the upper gate film comprises a doped polysilicon film,
wherein the fourth conductor film is formed of the same material as that of the first conductor film, and
wherein a top face of the fourth conductor film is at the same position as a top face of the first conductor film.

2. The semiconductor device according to claim 1, further comprising another metal gate film provided on the gate insulating film in the peripheral transistor region, the another metal gate film having the same thickness as the total thickness of the metal gate film and the upper gate film.

3. The semiconductor device according to claim 1, wherein the upper gate film includes a hard mask film, and the top face of the hard mask film is at the same position as the top face of the first interlayer insulating film.

4. The semiconductor device according to claim 3, further comprising a fifth conductor film formed of a doped polysilicon film and provided between the metal gate film and the hard mask film.

5. The semiconductor device according to claim 4, wherein the first conductor film contains polysilicon, the second conductor film contains tungsten, and the hard mask includes a silicon nitride film.

6. A semiconductor device comprising:
a semiconductor substrate in which a first region and a second region are defined;
a diffusion layer arranged on the semiconductor substrate in the first region;
a first interlayer insulating film arranged on the first region;
a contact plug passing through the first interlayer insulating film and electrically connected to the diffusion layer;
a transistor arranged in the second region and comprising a gate insulating film including a high-k film, a first conductor layer arranged on the gate insulating film, and a second conductor layer arranged on the first conductor layer;
a third conductor layer on the second conductor layer;
a fourth conductor layer connected to the contact plug; and
a fifth conductor layer on the third conductor layer, the fifth conductor layer being deposited in a same process step as the fourth conductor layer and containing a same material as that of the fourth conductor layer,
wherein as viewed from the surface of the semiconductor substrate, a height of a top face of the second conductor layer is equal to or lower than a height of a top face of the first interlayer insulating film.

7. The semiconductor device according to claim 6, wherein the contact plug contains polysilicon, the first conductor layer contains a metal, and the second conductor layer contains polysilicon.

8. The semiconductor device according to claim 6, wherein the third conductor layer is formed in a same process as the contact plug and contains the same material as the contact plug.

9. The semiconductor device according to claim 6, wherein as viewed from the surface of the semiconductor substrate, the height of the top face of the first interlayer insulating film is substantially the same as a height of the third conductor layer.

10. The semiconductor device according to claim 6, wherein the high-k film has a relative dielectric constant of 7 or more.

11. The semiconductor device according to claim 6, further comprising a transistor embedded in the semiconductor substrate in the first region, the fourth conductor layer constituting a bit line.

12. The semiconductor device according to claim 6, wherein the fourth conductor layer contains tungsten.

13. A semiconductor device comprising:
- a semiconductor substrate in which a first region and a second region are defined;
- a diffusion layer arranged on the semiconductor substrate in the first region;
- a first interlayer insulating film arranged on the first region;
- a contact plug passing through the first interlayer insulating film and electrically connected to the diffusion layer;
- a transistor arranged in the second region and comprising a gate insulating film, a metal layer arranged on the gate insulating film, and a first conductor layer arranged on the metal layer;
- a second conductor layer connected to the contact plug; and
- a third conductor layer on the first conductor layer, the third conductor layer being formed of the same material as that of the second conductor layer,
- wherein the first conductor layer, the metal layer, and the third conductor layer form a gate stack of the transistor,
- wherein as viewed from the surface of the semiconductor substrate, a height of a top face of the first conductor layer is substantially the same as a height of a top face of the first interlayer insulating film.

14. The semiconductor device according to claim 13, wherein the gate insulating film includes a high-k film having a relative dielectric constant of 7 or more.

15. The semiconductor device according to claim 13, wherein the first conductor layer and the contact plug contain polysilicon, and wherein the second conductor layer contains tungsten.

* * * * *